(12) United States Patent
Seo et al.

(10) Patent No.: US 11,832,468 B2
(45) Date of Patent: Nov. 28, 2023

(54) LIGHT EMITTING DEVICE WITH ELECTRON AUXILIARY LAYER INCLUDING METAL OXIDE NANOPARTICLES, METHOD OF MANUFACTURING THE DEVICE, AND A DISPLAY DEVICE

(71) Applicant: SAMSUNG ELECTRONICS CO., LTD., Suwon-si (KR)

(72) Inventors: Hongkyu Seo, Gwacheon-si (KR); Kwanghee Kim, Seoul (KR); Eun Joo Jang, Suwon-si (KR); Won Sik Yoon, Seoul (KR); Tae Hyung Kim, Seoul (KR); Tae Ho Kim, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 181 days.

(21) Appl. No.: 17/358,905

(22) Filed: Jun. 25, 2021

(65) Prior Publication Data
US 2022/0006036 A1    Jan. 6, 2022

(30) Foreign Application Priority Data

Jul. 1, 2020 (KR) .......................... 10-2020-0081057

(51) Int. Cl.
*H10K 50/16* (2023.01)
*H10K 71/00* (2023.01)
(Continued)

(52) U.S. Cl.
CPC ............. *H10K 50/16* (2023.02); *H10K 71/00* (2023.02); *H10K 85/60* (2023.02); *H10K 50/115* (2023.02);
(Continued)

(58) Field of Classification Search
CPC . H01L 51/508; H01L 51/5004; H01L 51/502; H01L 51/5036; H01L 51/56;
(Continued)

(56) References Cited

U.S. PATENT DOCUMENTS 6,645,645 B1    11/2003   Adachi et al.
7,700,200 B2    4/2010    Bulovic et al.
(Continued)

FOREIGN PATENT DOCUMENTS

EP    3486964 A1    5/2019
JP    2019114668 A   7/2019
(Continued)

OTHER PUBLICATIONS

Agnieszka Kołodziejczak-Radzimska, et al., Zinc Oxide-From Synthesis to Application: A Review, Materials 2014, 7, 2833-2881.
(Continued)

*Primary Examiner* — Caleb E Henry
(74) *Attorney, Agent, or Firm* — CANTOR COLBURN LLP

(57) ABSTRACT

Light emitting device, method of manufacturing the light emitting device, and display device including the light emitting device are disclosed. The light emitting device includes a first electrode and a second electrode each having a surface opposite the other, a light emitting layer including quantum dots that is disposed between the first electrode and the second electrode, and an electron auxiliary layer disposed between the light emitting layer and the second electrode, wherein the electron auxiliary layer includes metal oxide nanoparticles including an anion of an organic acid bound to a surface of the metal oxide nanoparticle.

20 Claims, 21 Drawing Sheets

(51) Int. Cl.
H10K 85/60 (2023.01)
H10K 50/115 (2023.01)
H10K 102/00 (2023.01)

(52) U.S. Cl.
CPC ... *H10K 2102/00* (2023.02); *H10K 2102/331* (2023.02)

(58) Field of Classification Search
CPC ....... H01L 2251/5369; H01L 2251/558; H01L 51/5072; H01L 51/5096; H01L 51/5088; H01L 51/5056; H01L 51/0003; H01L 2251/303; H10K 50/16; H10K 71/00; H10K 85/60; H10K 50/115; H10K 2102/00; H10K 2102/331; H10K 50/15; H10K 50/17; H10K 50/18; H10K 71/12; C09K 11/883; C09K 11/02

See application file for complete search history.

(56) References Cited

U.S. PATENT DOCUMENTS

| | | | | |
|---|---|---|---|---|
| 9,559,327 | B2* | 1/2017 | Yoneda | H10K 50/16 |
| 9,564,609 | B2* | 2/2017 | Sasaki | H10K 50/818 |
| 9,577,206 | B2* | 2/2017 | Yamae | H10K 50/131 |
| 9,647,228 | B2* | 5/2017 | Seo | H10K 50/155 |
| 9,653,517 | B2* | 5/2017 | Uesaka | H10K 59/32 |
| 10,522,775 | B2* | 12/2019 | Tsukamoto | H05B 33/12 |
| 10,826,010 | B1* | 11/2020 | Montgomery | H10K 50/115 |
| 2002/0189542 | A1* | 12/2002 | Van Slyke | C23C 14/12 |
| | | | | 118/712 |
| 2003/0211651 | A1* | 11/2003 | Krasnov | C09K 11/883 |
| | | | | 438/102 |
| 2005/0098207 | A1* | 5/2005 | Matsumoto | H10K 50/19 |
| | | | | 313/506 |
| 2005/0274944 | A1 | 12/2005 | Jang et al. | |
| 2008/0264475 | A1* | 10/2008 | Ito | H10K 71/125 |
| | | | | 136/252 |
| 2008/0290797 | A1 | 11/2008 | Park et al. | |
| 2009/0039764 | A1 | 2/2009 | Cho et al. | |
| 2009/0243473 | A1* | 10/2009 | Iwakuma | H10K 50/14 |
| | | | | 313/504 |
| 2010/0108984 | A1 | 5/2010 | Cho et al. | |
| 2012/0032138 | A1 | 2/2012 | Kim et al. | |
| 2012/0086331 | A1* | 4/2012 | Kobayashi | H10K 71/00 |
| | | | | 313/504 |
| 2013/0277669 | A1 | 10/2013 | Krebs et al. | |
| 2014/0014896 | A1 | 1/2014 | Chung et al. | |
| 2015/0076494 | A1 | 3/2015 | Pickett et al. | |
| 2016/0150619 | A1* | 5/2016 | Krummacher | H05B 45/60 |
| | | | | 315/224 |
| 2016/0233449 | A1* | 8/2016 | Murayama | C09K 11/883 |
| 2017/0012231 | A1* | 1/2017 | Mishima | H10K 2101/40 |
| 2018/0062101 | A1* | 3/2018 | Li | H10K 50/125 |
| 2018/0254421 | A1* | 9/2018 | Kinge | H10K 50/15 |
| 2019/0157596 | A1 | 5/2019 | Kim et al. | |
| 2020/0266348 | A1* | 8/2020 | Kim | C09K 11/883 |
| 2020/0321490 | A1* | 10/2020 | Yang | H01L 33/06 |
| 2020/0321546 | A1* | 10/2020 | He | H10K 50/11 |
| 2020/0328380 | A1* | 10/2020 | Benzie | H10K 50/16 |
| 2020/0411719 | A1* | 12/2020 | Kimoto | H05B 33/14 |

FOREIGN PATENT DOCUMENTS

| | | |
|---|---|---|
| KR | 20110132165 A | 12/2011 |
| KR | 20130074815 | 7/2013 |
| KR | 20150121355 A | 10/2015 |
| WO | 2005122293 A2 | 12/2005 |
| WO | 2012041847 A1 | 4/2012 |

OTHER PUBLICATIONS

Chang-Yeol Han, et al., More Than 9% Efficient ZnSeTe Quantum Dot-Based Blue Electroluminescent DevicesACS Energy Lett. 5, 1568-1576 (2020) 1568-1576.

Eun-Pyo Jang, et al., Synthesis of Alloyed ZnSeTe Quantum Dots as Bright, Color-Pure Blue Emitters ACS Appl. Mater. Interfaces 11, 46062-46069 (2019).

Reed T. Heintzkill, MS Thesis, Dec. 2018, Fabrication of Silver-Doped Zinc Oxide Thin Films Through Optimized Sol-Gel Deposition and Nanoparticle Wetting Process.

Extended European Search Report dated Nov. 18, 2021, of the corresponding European Patent Application No. 21182445.3, 9 pp.

Per Axel Clausen, et al., Materials 2019, vol. 12, 3657, No. 22, 21 pp.

Torben Schindler, et al., Journal of Colloid and Interface Science, Academic Press, Inc, vol. 504, May 19, 2017, pp. 356-362.

* cited by examiner

FIG. 19
| Comparative Example 1 | Example 1 | Example 2 |
|---|---|---|
| 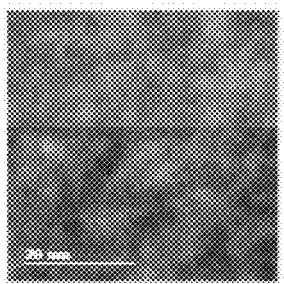 | 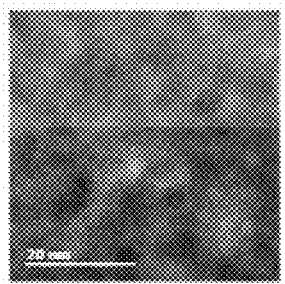 | 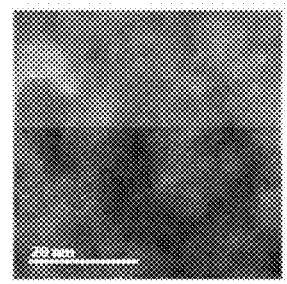 |
| 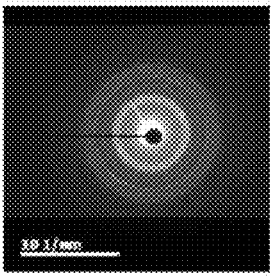 | 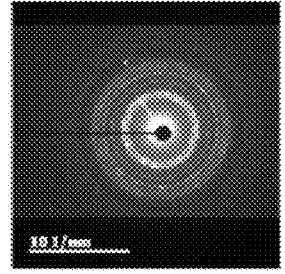 | 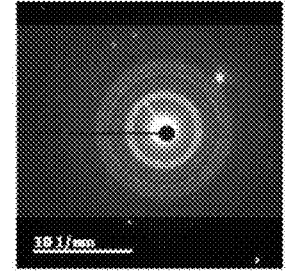 |
| 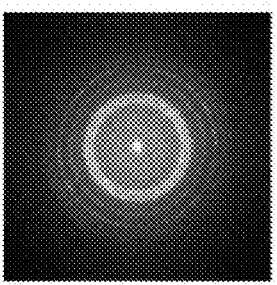 | 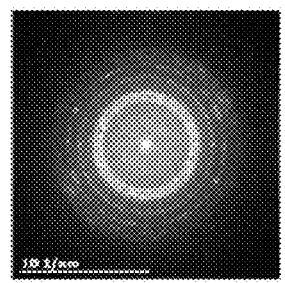 | 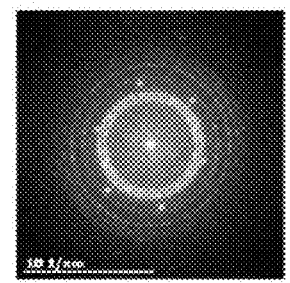 |

FIG. 21
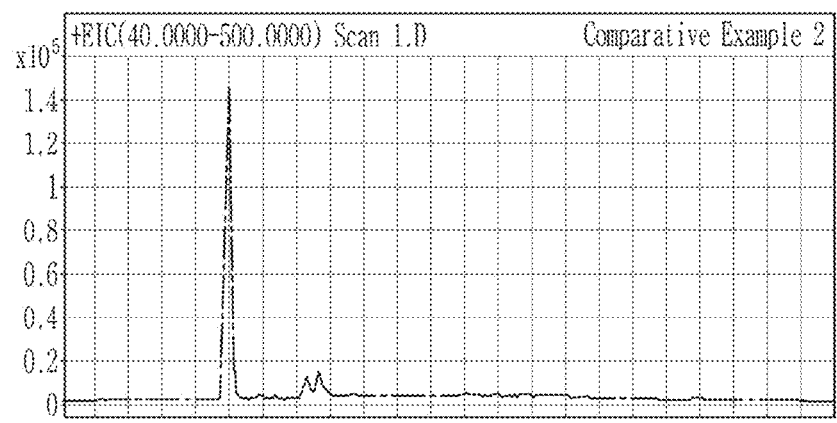
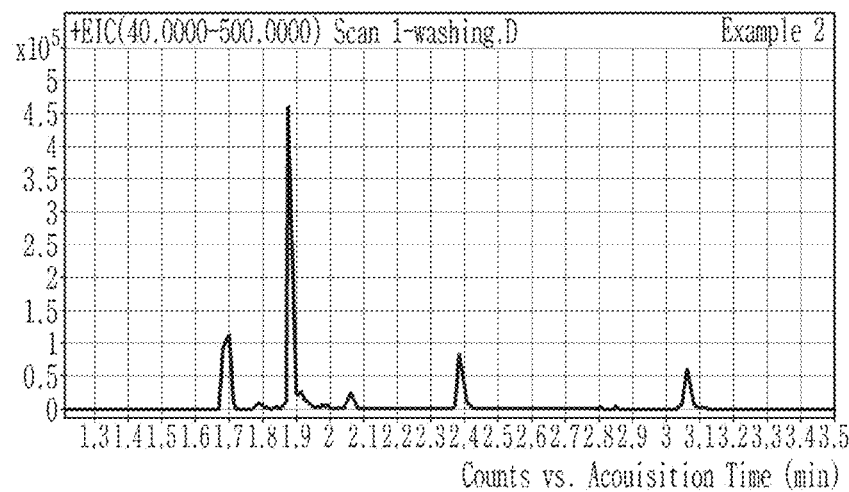

LIGHT EMITTING DEVICE WITH ELECTRON AUXILIARY LAYER INCLUDING METAL OXIDE NANOPARTICLES, METHOD OF MANUFACTURING THE DEVICE, AND A DISPLAY DEVICE

CROSS-REFERENCE TO RELATED APPLICATION

This application claims priority to Korean Patent Application No. 10-2020-0081057 filed in the Korean Intellectual Property Office on Jul. 1, 2020, and all the benefits accruing therefrom under 35 U.S.C. § 119, the content of which in its entirety is incorporated herein by reference.

BACKGROUND

1. Field

A light emitting device, a method of manufacturing the light emitting device, and a display device including the light emitting device are disclosed.

2. Description of the Related Art

Unlike bulk materials, physical characteristics (e.g., energy bandgaps, melting points, etc.) of nanoparticles that are known as intrinsic characteristics may be controlled by changing their particle sizes. For example, when a semiconductor nanocrystal also known as a quantum dot (QD) is irradiated with light or an electric current is applied, the quantum dot may emit light in a wavelength corresponding to the size of the quantum dot. Accordingly, the quantum dots may be used as a light emitting body that emits light of a particular wavelength.

SUMMARY

A light emitting device that addresses a technical problem, that is an undesired increase in leakage current due to nanoparticle defects in the electron transport layer, and a consequent reduction in device efficiency, is described.

The presence of residual organic substances on the nanoparticle surface may lead to a decrease in electron mobility, a reduction in luminance, or a charging phenomenon leading to device deterioration, e.g., a reduction in life-span. Accordingly, a light emitting device that may address a technical problem resulting from residual organic substances at the interface between the light emitting layer including quantum dots and the electron transport layer is described.

An embodiment provides a display device including the light emitting device.

According to an embodiment, a light emitting device includes a first electrode and a second electrode each having a surface opposite the other, a light emitting layer including quantum dots that is disposed between the first electrode and the second electrode, and an electron auxiliary layer disposed between the light emitting layer and the second electrode, wherein the electron auxiliary layer includes metal oxide nanoparticles including an anion of an organic acid bound to a surface of the metal oxide nanoparticle.

The anion of the organic acid may be chemically bonded with a metal ion at a surface of the metal oxide nanoparticles, or provide a bonded product of the metal ion with an oxygen or a hydroxyl group, or a combination thereof.

The organic acid may have a molecular weight of about 30 grams/mole (g/mol) to about 600 g/mol.

The organic acid may have $pK_a$ of about 1 to about 5.

The anion of the organic acid may include an anion of $RCOOH$, $RSO_2H$, $RSO_3H$, $ArOH$, $ArSH$, $RCN\!=\!NOH$, $RCN\!=\!C(OH)R'$, $RCONHCOR'$, $ArSO_2NH_2$, $ArSO_2NHR$, $RCH_2NO_2$, $R_2CHNO_2$ (wherein, R and R' are the same or different and are each independently a hydrogen, a substituted or unsubstituted C1 to C24 aliphatic hydrocarbon group, a substituted or unsubstituted C3 to C40 alicyclic hydrocarbon group, or a combination thereof, wherein at least one R in $R_2CHNO_2$ is not hydrogen, and Ar is a substituted or unsubstituted C6 to C20 aromatic hydrocarbon group), or a combination thereof.

The anion of the organic acid may include citrate ion, acetate ion, oxalate ion, sulfonate ion, or a combination thereof.

The anion of the organic acid may be present on a surface of the metal oxide nanoparticles in an amount of about 0.001 weight percent (wt %) to about 10 wt % based on a total weight of the metal oxide nanoparticles in the electron auxiliary layer.

The electron auxiliary layer may have a mole ratio of carbon atoms to all metal atoms of the metal oxide nanoparticles of less than or equal to about 1.3:1.

A content of a basic material in the metal oxide nanoparticles may be less than or equal to about 2 wt % based on a total weight of the metal oxide nanoparticles in the electron auxiliary layer.

The basic material, if present, may include tetramethyl ammonium hydroxide (TMAH), potassium hydroxide (KOH), sodium hydroxide (NaOH), lithium hydroxide (LiOH), or a combination thereof. There may be no amount of the foregoing basic materials present in the metal oxide nanoparticles.

The electron auxiliary layer may have an electrical conductivity of greater than about $6.5 \times 10^{-8}$ siemens per centimeter (S/cm).

The metal oxide may include Zn, Mg, Ca, Zr, W, Li, Ti, Y, Al, or a combination thereof.

The metal oxide may be represented by Chemical Formula 1.

$$Zn_{1-x}M_xO \qquad \text{Chemical Formula 1}$$

In Chemical Formula 1, M is Mg, Ca, Zr, W, Li, Ti, Y, Al, or a combination thereof, and $0 \leq x \leq 0.5$.

The metal oxide may include zinc oxide, zinc magnesium oxide, or a combination thereof.

The metal oxide nanoparticles may have an average particle size of greater than or equal to about 1 nanometer (nm) and less than or equal to about 100 nm.

The light emitting device may further include a hole auxiliary layer including a hole injecting layer (HIL), a hole transporting layer (HTL), an electron blocking layer (EBL), or a combination thereof between the first electrode and the light emitting layer.

The light emitting device may have a maximum external quantum efficiency ($EQE_{Max}$) of greater than or equal to about 10%, and a luminance of greater than or equal to about 50,000 nit.

According to another embodiment, a method of manufacturing a light emitting device includes forming an electron auxiliary layer including metal oxide nanoparticles; and contacting the electron auxiliary layer with an organic acid or a solution including an organic acid. The contacting may include contacting with a solution including an organic acid. Use of the solution of the organic acid is preferred.

The contacting of the electron auxiliary layer with the organic acid or a solution including an organic acid may include coating the electron auxiliary layer with the organic acid or the solution including the organic acid, or dipping the electron auxiliary layer in the organic acid or a solution including the organic acid.

The coating process may include spin coating, bar coating, spray coating, slit coating, ink jet printing, nozzle printing, spraying, or doctor blade coating.

According to another embodiment, a display device including the light emitting device is provided.

In a light emitting device according to an embodiment, driving voltage is decreased, and device efficiency is increased, due to a decrease in hole leakage current of the electron transport layer. Moreover, hole blocking of the electron transport layer is more effective, and electron mobility increases, thereby increasing device luminance. The interface charging between the light emitting layer including the quantum dots and the electron transport layer is also addressed to reduce device deterioration, and thus, increase the life-span of the device.

BRIEF DESCRIPTION OF THE DRAWINGS

FIG. 19 is a showing of comparative data of selective area diffraction pattern (SADP) analysis of the electron auxiliary layer of Examples 1 and 2 and Comparative Example 1 in accordance with Experimental Example 4.

FIG. 21 is a comparative gas chromatography (GC) analysis of Example 2 and Comparative Example 2 of the electron auxiliary layer in accordance with Experimental Example 5.

DETAILED DESCRIPTION

Figure 1:
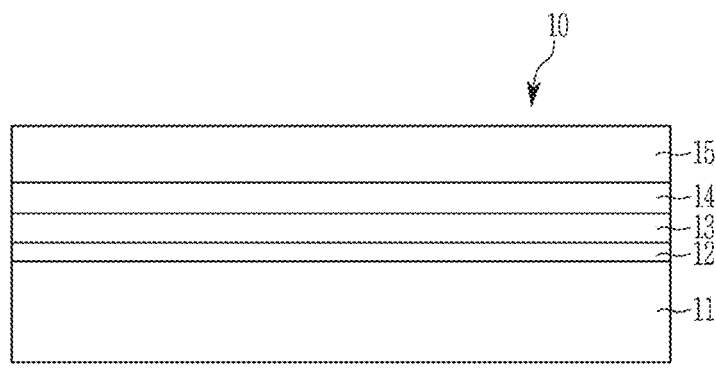
FIG. 1 is a schematic cross-sectional view of a light emitting device according to an embodiment.

Advantages and features of the technology, and a method of achieving them will become apparent with reference to embodiments with the accompanying drawings. However, the embodiments should not be construed as being limited to the embodiments set forth herein.

If not defined otherwise, all terms (including technical and scientific terms) in the specification may be defined as commonly understood by one skilled in the art. It will be further understood that terms such as those defined in commonly-used dictionaries should not be interpreted ideally or exaggeratedly and should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as being limited to "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% of the stated value.

As used herein, when a definition is not otherwise provided, "substituted" refer to replacement of hydrogen of a compound or a corresponding moiety by a substituent that is a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 (or C15) cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$)), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "monocyclic aromatic ring group" refers to a carbocyclic group providing a conjugation structure (e.g., a C6 to C12 aryl group or a C6 to C8 aryl group) or a heterocyclic group providing a conjugation structure (e.g., a C2 to C12 heteroaryl group or a C2 to C4 heteroaryl group).

As used herein, "condensed polycyclic aromatic ring group" refers to a cyclic group formed by condensing at least two monocyclic aromatic ring groups, for example a C8 to C20 aryl group, for example a C8 to C15 aryl group, or a C4 to C20 heteroaryl group, for example a C4 to C15 heteroaryl group.

As used herein, "hetero" refers to compound or group that includes an atom that is not carbon or hydrogen, for example a compound or group including 1 to 3 heteroatoms of N, O, S, Si, P, or a combination thereof.

As used herein, "Group" refers to a group of Periodic Table.

As used herein, "Group II" may include Group IIA and Group IIB, and examples of Group II metal may be Cd, Zn, Hg, and Mg, but are not limited thereto.

As used herein, "Group III" may include Group IIIA and Group IIIB, and examples of Group III metal may be Al, In, Ga, and Tl, but are not limited thereto.

As used herein, "Group IV" may include Group IVA and Group IVB, and examples of a Group IV metal may be Si, Ge, and Sn, but are not limited thereto. As used herein, "metal" may include a semi-metal such as Si.

As used herein, "Group I" may include Group IA and Group IB, and examples may include Li, Na, K, Rb, and Cs, but are not limited thereto.

As used herein, "Group V" may include Group VA, and examples may include nitrogen, phosphorus, arsenic, antimony, and bismuth, but are not limited thereto.

As used herein, "Group VI" may include Group VIA, and examples may include sulfur, selenium, and tellurium, but are not limited thereto.

Hereinafter, a light emitting device according to an embodiment is described with reference to drawings.

FIG. 1 is a schematic cross-sectional view of a light emitting device according to an embodiment.

Referring to FIG. 1, a light emitting device 10 according to an embodiment includes a first electrode 11 and a second electrode 15 each having a surface opposite the other, a light emitting layer 13 including quantum dots, and disposed between the first electrode 11 and the second electrode 15, a hole auxiliary layer 12 between the first electrode 11 and the light emitting layer 13, and an electron auxiliary layer 14 disposed between the second electrode 15 and the light emitting layer 13.

A substrate (not shown) may be disposed at the side of the first electrode 11 or the second electrode 15. For example, the substrate may be disposed at the first electrode side. The substrate may be a substrate including an electrically insulating material (hereinafter, also referred to as an "insulation material) (e.g., an electrically insulating transparent substrate). The substrate may include glass; various polymers such as polyesters (e.g., polyethylene terephthalate (PET), polyethylene naphthalate (PEN)), polycarbonate, polyacrylate, polyimide, and polyamide-imide; polysiloxane (e.g. polydimethyl siloxane (PDMS)); inorganic materials such as Al$_2$O$_3$ and ZnO; or a combination thereof, but is not limited thereto. The substrate may be made of a silicon wafer. Herein "transparent" may refer to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of an electrically conductive material (hereinafter, also referred to as a "conductor"), for example a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or SnO$_2$ and Sb, but is not limited thereto. For example, the first electrode 11 may include a transparent conductive metal oxide, for example, indium tin oxide (ITO).

The second electrode 15 may be made of a conductor, for example a metal, a conductive metal oxide, and/or a conductive polymer. The second electrode 15 may be made of, for example, a metal or an alloy thereof such as aluminum, magnesium, calcium, sodium, potassium, titanium, indium, yttrium, lithium, gadolinium, silver, tin, lead, cesium, or barium; or a multi-layer structured material such as LiF/Al, LiO$_2$/Al, Liq/Al, LiF/Ca, and BaF$_2$/Ca, but is not limited thereto. The conductive metal oxide is the same as described above.

At least one of the first electrode 11 or the second electrode 15 may be a light-transmitting electrode and the light-transmitting electrode may be for example made of an electrically conductive oxide such as a zinc oxide, indium oxide, tin oxide, indium tin oxide (ITO), indium zinc oxide (IZO), or fluorine doped tin oxide, or a metal thin layer of a single layer or a multilayer. If one of the first electrode 11 and the second electrode 15 is a non-light-transmitting electrode, the electrode may be made of for example an opaque conductor such as aluminum (Al), silver (Ag), or gold (Au).

Each thickness of the first electrode 11 and/or the second electrode 15 is not particularly limited and may be appropriately selected considering device efficiency. For example, the thickness of the electrodes may be greater than or equal to about 5 nanometers (nm), for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The light emitting layer 13 includes a plurality of quantum dots. The quantum dots (hereinafter, also referred to as semiconductor nanocrystals) may include a Group II-VI compound, a Group III-V compound, a Group IV-VI compound, a Group IV element or compound, a Group I-III-VI compound, a Group I-II-IV-VI compound, or a combination thereof.

The Group II-VI compound may be a binary element compound such as CdSe, CdTe, ZnS, ZnSe, ZnTe, ZnO, HgS, HgSe, HgTe, MgSe, MgS, or a mixture thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InAlAsSb, or a mixture thereof. The Group III-V compound may further include a Group II metal (e.g., InZnP). The Group IV-VI compound may be a binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe, or a mixture thereof; or a quaternary element compound such as SnPbSSe, SnPbSeTe, SnPbSTe, or a mixture thereof. Examples of the Group compound may include CuInSe$_2$, CuInS$_2$, CuInGaSe, or CuInGaS, but are not limited thereto. Examples of the Group I-II-IV-VI compound may include CuZnSnSe or CuZnSnS, but are not limited thereto. The Group IV element or compound may be a single substance such as Si, Ge, or a mixture thereof; or a binary element compound such as SiC, SiGe, or a mixture thereof.

For example, the quantum dot may not include cadmium. The quantum dots may include a Group III-V compound-based semiconductor nanocrystal including indium and phosphorus. The Group III-V compound may further include zinc. The quantum dots may include a Group II-VI compound-based semiconductor nanocrystal including a chalcogen element (e.g., sulfur, selenium, tellurium, or a combination thereof) and zinc.

In the quantum dots, the aforementioned single substance, binary element compound, ternary element compound and/or the quaternary element compound respectively exist in a uniform concentration in the semiconductor nanocrystal particles or at least partially different concentrations in the same particles. The semiconductor nanocrystals may have a core/shell structure wherein a first semiconductor nanocrystal (core) is surrounded by another second semiconductor nanocrystal (shell) having the same or different composition. In an embodiment, the quantum dots may include a core including InP, InZnP, ZnSe, ZnSeTe, or a combination thereof and a shell (or a multi-layered shell) having a different composition from the core and including InP, InZnP, ZnSe, ZnS, ZnSeTe, ZnSeS, or a combination thereof.

The core and the shell may have an interface, and an element of at least one of the core or the shell in the interface may have a concentration gradient wherein the concentration of the element(s) of the shell decreases toward the core. The semiconductor nanocrystals may have a structure including one semiconductor nanocrystal core and a multi-layered shell surrounding the same. Herein, the multi-layered shell has at least two shells wherein each shell may be a single composition, an alloy, and/or a shell having a concentration gradient.

In the quantum dots, the shell material and the core material may each have a different energy bandgap from each other. For example, the energy bandgap of the shell material may be greater than that of the core material. Alternatively, the energy bandgap of the shell material may be less than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

The quantum dots may have a controlled absorption/photoluminescence wavelength by adjusting a composition and a size of the quantum dots. A maximum photoluminescence peak wavelength of the quantum dots may be an ultraviolet (UV) to infrared (IR) wavelength or a wavelength of greater than the above wavelength range. For example, the maximum photoluminescence peak wavelength of the quantum dots may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum photoluminescence wavelength of the quantum dots may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum photoluminescence wavelength of the quantum dots may be in the range of about 500 nm to about 650 nm. The maximum photoluminescence wavelength of the quantum dots may be in the range of about 500 nm to about 540 nm. The maximum photoluminescence wavelength of the quantum dots may be in the range of about 610 nm to about 640 nm.

The quantum dots may have a quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a relatively narrow photoluminescence wavelength spectrum. The quantum dots may have for example a full width at half maximum (FWHM) of a photoluminescence wavelength spectrum of less than or equal to about 50 nm, for example less than or equal to about 45 nm, less than or equal to about 40 nm, or less than or equal to about 30 nm.

The quantum dots may have an average particle size (e.g., a diameter or the largest linear length crossing the particle) of greater than or equal to about 1 nm and less than or equal to about 100 nm. The quantum dots may have a particle size of about 1 nm to about 100 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shapes of the quantum dots are not particularly limited. For example, the shapes of the quantum dots may be a sphere, a polyhedron, a pyramid, a multipod, a cube, a rectangular parallelepiped, a nanotube, a nanorod, a nanowire, a nanosheet, or a combination thereof, but are not limited thereto.

As used herein, particle sizes (e.g., those of metal oxide nanoparticles and quantum dot particles) may be obtained from commercially available image analysis programs (e.g., Image J) using images obtained from electron microscopy analysis (two-dimensional images). The "average" in "average particle size" may be mean, mode, or median.

The quantum dots may be commercially available or may be appropriately synthesized. When quantum dots are colloid-synthesized, the particle size may be relatively freely controlled (e.g., random) and also uniformly controlled.

The quantum dots may include for example an organic ligand having a hydrophobic moiety. The organic ligand moiety may be bound to a surface of the quantum dots. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 (or C5) to C24 substituted or unsubstituted aliphatic hydrocarbon group such as a C3 (or C5) to C24 alkyl or alkenyl group, a C6 to C20 substituted or unsubstituted aromatic hydrocarbon group such as a C6 to C20 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; an oxide of a phosphine compound such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; a diphenyl phosphine, a triphenyl phosphine compound, or an oxide compound thereof; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; a C5 to C20 alkyl phosphonic acid; and the like, but are not limited thereto. The quantum dots may include a single type of hydrophobic organic ligand or may include a mixture of at least two types. The hydrophobic organic ligand may not include a photopolymerizable moiety, for example, an acrylate group, a methacrylate group, and the like.

For example, the light emitting layer 13 may include a monolayer of quantum dots. Alternatively, the light emitting layer 13 may include one monolayer of quantum dots, for example, 2 or more layers, 3 or more layers, or 4 or more layers, and 20 or fewer layers, for example, 10 or fewer layers, 9 or fewer layers, 8 or fewer layers, 7 or fewer layers, or 6 or fewer layers. The light emitting layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 13 may have for example a thickness of about 10 nm to about 150 nm, for example about 10 nm to about 100 nm, for example about 10 nm to about 50 nm.

The light emitting layer 13 may have a highest occupied molecular orbital (HOMO) energy level of greater than or equal to about 5.4 electron Volts (eV), greater than or equal to about 5.6 eV, greater than or equal to about 5.7 eV, greater than or equal to about 5.8 eV, greater than or equal to about 5.9 eV, or greater than or equal to about 6.0 eV. The light emitting layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. For example, the light emitting layer 13 may have a HOMO energy level of about 5.6 eV to about 6.0 eV.

The light emitting layer 13 may have for example a lowest unoccupied molecular orbital (LUMO) energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The light emitting layer 13 may have an LUMO energy level of greater than or equal to about 2.4 eV, or greater than or equal to about 2.5 eV. For example, the light emitting layer 13 may have an energy bandgap of about 2.4 eV to about 2.9 eV.

The hole auxiliary layer 12 is disposed between the first electrode 11 and the light emitting layer 13. The hole auxiliary layer 12 may have one layer or two or more layers, and may include for example a hole injection layer (HIL), a hole transport layer (HTL), and/or an electron blocking layer.

The hole auxiliary layer 12 may have a HOMO energy level which may match a HOMO energy level of the light emitting layer 13 and may reinforce mobility of holes from the hole auxiliary layer 12 into the light emitting layer 13.

The HOMO energy level of the hole auxiliary layer 12 (e.g., hole transport layer (HTL)) contacting the light emitting layer 13 may be the same as or less than the HOMO energy level of the light emitting layer 13 by a value within a range of less than or equal to about 1.0 eV. For example, a difference of HOMO energy levels between the hole auxiliary layer 12 and the light emitting layer 13 may be 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be for example greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

For example, the hole auxiliary layer 12 may include a hole injection layer near to the first electrode 11 and a hole transport layer near to the light emitting layer 13. Herein, the HOMO energy level of the hole injection layer may be about 5.0 eV to about 6.0 eV, about 5.0 eV to about 5.5 eV, or about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material included in the hole auxiliary layer 12 is not particularly limited and may include for example at least one of poly(9,9-dioctyl-fluorene-co-N-(4-butylphenyl)-diphenylamine) (TFB), polyarylamine, poly(N-vinylcarbazole), poly(3,4-ethylenedioxythiophene)(PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-toly)amino]triphenylamine), 4,4',4"-tris(N-carbazolyl)-triphenylamine (TCTA), 1,1-bis[4-(N, N-di-4-tolylamino) phenyl]cyclohexane (TAPC), p-type metal oxide (e.g., NiO, WO₃, MoO₃, etc.), a carbon-based material such as graphene oxide, or a combination thereof, but is not limited thereto.

In the hole auxiliary layer(s), a thickness of each layer may be appropriately selected. For example, the thickness of each layer may be greater than or equal to about 10 nm, for example, greater than or equal to about 15 nm, or greater than or equal to about 20 nm and less than or equal to about 100 nm, for example, less than or equal to about 90 nm, less than or equal to about 80 nm, less than or equal to about 70 nm, less than or equal to about 60 nm, or less than or equal to about 50 nm, but is not limited thereto.

The electron auxiliary layer 14 is disposed between the light emitting layer 13 and the second electrode 15. The electron auxiliary layer 14 may include for example an electron injection layer, an electron transport layer, and/or a hole blocking layer, but is not limited thereto.

For example, the electron auxiliary layer 14 may be an electron transport layer. The electron auxiliary layer 14 includes metal oxide nanoparticles including an anion of an organic acid bound to a surface of the metal oxide nanoparticle.

The metal oxide may be an oxide of a metal including Zn, Mg, Ca, Zr, W, Li, Ti, Y, Al, or a combination thereof.

For example, the metal oxide may be represented by Chemical Formula 1.

$$Zn_{1-x}M_xO \qquad \text{Chemical Formula 1}$$

In Chemical Formula 1, M may be Mg, Ca, Zr, W, Li, Ti, Y, Al, or a combination thereof, for example Mg. In Chemical Formula 1, x may be greater than or equal to 0 and less than or equal to about 0.5, for example greater than or equal to about 0.01 and less than or equal to about 0.3, or greater than or equal to about 0.01 and less than or equal to about 0.15.

For example, the metal oxide may include zinc oxide, zinc magnesium oxide, or a combination thereof.

The nanoparticles may have an average particle size of greater than or equal to about 1 nm, for example, greater than or equal to about 1.5 nm, greater than or equal to about 2 nm, greater than or equal to about 2.5 nm, or greater than or equal to about 3 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape, or a nanowire shape. In an embodiment, the nanoparticles may be spherical or essentially spherical.

An absolute value of LUMO of the quantum dots may be less than an absolute value of LUMO of the metal oxide. An absolute value of LUMO of the quantum dots may be greater than an absolute value of LUMO of the metal oxide.

The metal oxide may have a LUMO absolute value of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

The metal oxide may have a HOMO absolute value of greater than or equal to about 5 eV, greater than or equal to about 5.5 eV, greater than or equal to about 6 eV, greater than or equal to about 6.5 eV, or greater than or equal to about 7 eV and less than or equal to about 8 eV, less than or equal to about 7.5 eV, less than or equal to about 7 eV, less than or equal to about 6.5 eV, or less than or equal to about 6 eV.

The metal oxide may have an energy bandgap of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

In a (electroluminescent) quantum dot light emitting device (QD-LED), holes and electrons are injected from the first electrode 11 and the second electrode 15, respectively. The injected electrons pass through common layers (e.g., an electron auxiliary layer such as an electron injection layer, an electron transport layer). The injected holes pass through a hole auxiliary layer such as a hole injection layer, a hole transport layer. The electrons and holes may combine in the light emitting layer 13 including quantum dots to form an exciton and emit light.

The common layers disposed between the light emitting layer 13 and the first electrode 11, and common layer disposed between the light emitting layer 13 and the second electrode 15, inject holes and electrons, respectively, as a voltage is applied. In the electron auxiliary layer, for example, the electron transport layer (ETL) has sufficient electron mobility capable of balancing holes/electrons in the light emitting layer 13, and plays a role of efficiently transferring the electrons from the second electrode 15 to the quantum dot light emitting layer 13. In addition, the electron auxiliary layer has an appropriately deep HOMO energy level, and thus, plays a role of sufficiently blocking the holes that may escape from the quantum dot light emitting layer 13.

For example, the electron transport layer (ETL) includes the metal oxide nanoparticles, wherein the metal oxide nanoparticles may have superior electron mobility to that of an organic semiconductor material widely used for the electron transport layer (ETL) of an OLED, but in some instances, facilitate the transfer of holes through defects positioned on a surface of the nanoparticles. The presence of such defect may lead to a relatively high leakage current, and this high leakage current may ultimately deteriorate efficiency of the quantum dot light emitting device (QD-LED). In addition, when the metal oxide nanoparticles are synthesized by using various organic-inorganic precursors, organic materials that are present or formed in the synthesis may act as an insulator on the surfaces of the metal oxide nanoparticles or among (i.e., between) the nanoparticles and thus, deteriorate electron mobility and cause charging due to charge accumulation on the interface of the quantum dot light emitting layer 13 and the electron transport layer (ETL). The presence of this charge accumulation may lead to a deterioration in luminance and life-span of the quantum dot light emitting device (QD-LED).

In the light emitting device 10 according to an embodiment, the electron auxiliary layer 14 (e.g., the electron transport layer (ETL)) may include metal oxide nanoparticles including an anion of an organic acid bound to a surface of the metal oxide nanoparticle. The metal oxide nanoparticles are surface-modified with the organic acid. The term, "surface-modified with an organic acid" refers to a surface of a metal oxide nanoparticle that is modified by coming in contact with an anion of an organic acid.

As described herein, the added anion of the organic acid may form a bond (an ionic, covalent, or coordinate bond as described below) with metal sites of the metal oxide nanoparticles, as seen, for example, in the schematic representation of FIG. 2. Accordingly, the electron auxiliary layer 14 with the surface-modified metal oxide nanoparticles may exhibit a reduction in leakage current, or reduces or eliminates much, if not all, of electron or charge accumulation on a surface of the metal oxide nanoparticle.

The anion of the organic acid may form a chemical bond with metal ions on the surface of the metal oxide nanoparticles, or provide a bonded product of the metal ions and an oxygen or hydroxyl group, or a combination thereof. Without being bound by theory, it is believed that the anion of the organic acid passivates the surface defects of the metal oxide nanoparticles, and desorbs residual organic substances that may be present or that may form during synthesis on the surfaces of the nanoparticle. The result of such passivation is metal oxide nanoparticles having high conductivity with fewer or less surface defects. Accordingly, the electron auxiliary layer 14 may increase quantum and/or voltage efficiency, or a life-span of the quantum dot light emitting device 10.

The anion of the organic acid may be an acidic organic material having a functional group capable of binding to the surface of the metal oxide nanoparticles, for example an anion of RCOOH, RSO$_2$H, RSO$_3$H, ArOH, ArSH, RCN=NOH, RCN=C(OH)R', RCONHCOR', ArSO$_2$NH$_2$, ArSO$_2$NHR, RCH$_2$NO$_2$, R$_2$CHNO$_2$, or a combination thereof, wherein R and R' are the same or different, and each independently hydrogen, a substituted or unsubstituted C1 (or C3) to C40 (or C24) aliphatic hydrocarbon group (e.g., C1 (or C3) to C40 (or C24) alkyl group, a C2 (or C3) to C40 (or C24) alkenyl group, or a C2 (or C3) to C40 (or C24) alkynyl group), a substituted or unsubstituted C3 to C40 alicyclic hydrocarbon group, or a combination thereof, provided that at least one R in R$_2$CHNO$_2$ is not hydrogen, and Ar is a substituted or unsubstituted C6 to C20 aromatic hydrocarbon group (e.g., a C6 to C20 aryl group).

The organic acid may have a molecular weight of greater than or equal to about 30 grams per mole (g/mol), for example, greater than or equal to about 40 g/mol, greater than or equal to about 50 g/mol, greater than or equal to about 60 g/mol, greater than or equal to about 70 g/mol, greater than or equal to about 80 g/mol, greater than or equal to about 90 g/mol, or greater than or equal to about 100 g/mol and less than or equal to about 600 g/mol, for example less than or equal to about 500 g/mol, less than or equal to about 400 g/mol, less than or equal to about 300 g/mol, or less than or equal to about 200 g/mol, for example, about 30 g/mol to about 600 g/mol, for example about 50 g/mol to about 500 g/mol, about 80 g/mol to about 400 g/mol, about 100 g/mol to about 300 g/mol, or about 50 g/mol to about 200 g/mol.

The organic acid may have pK$_a$ of greater than or equal to about 1, for example greater than or equal to about 1.5, greater than or equal to about 2, or greater than or equal to about 2.5 and less than or equal to about 5, for example less than or equal to about 4.5, less than or equal to about 4, or less than or equal to about 3.5, about 1 to about 5, for example about 1.5 to about 4.5, about 2 to about 4, or about 2.5 to about 3.5.

For example, citrate ion, acetate ion, oxalate ion, sulfonate ion, or a combination thereof may be exemplified as an anion of an organic acid that may satisfy the ranges of the molecular weight and pK$_a$ of the organic acid. In particular, a sulfonic acid having a molecular weight of less than or equal to about 600 g/mol may be used.

Figure 2:
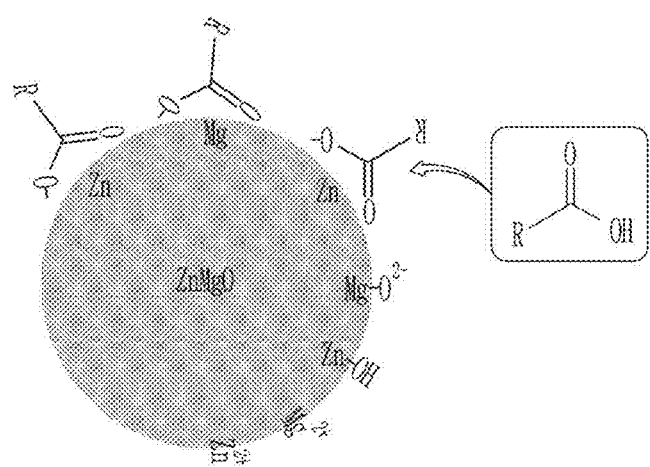
FIG. 2 is a schematic illustration of a metal oxide nanoparticle including an anion of an organic acid included in an electron auxiliary layer of a light emitting device according to an embodiment.
Figure 3:
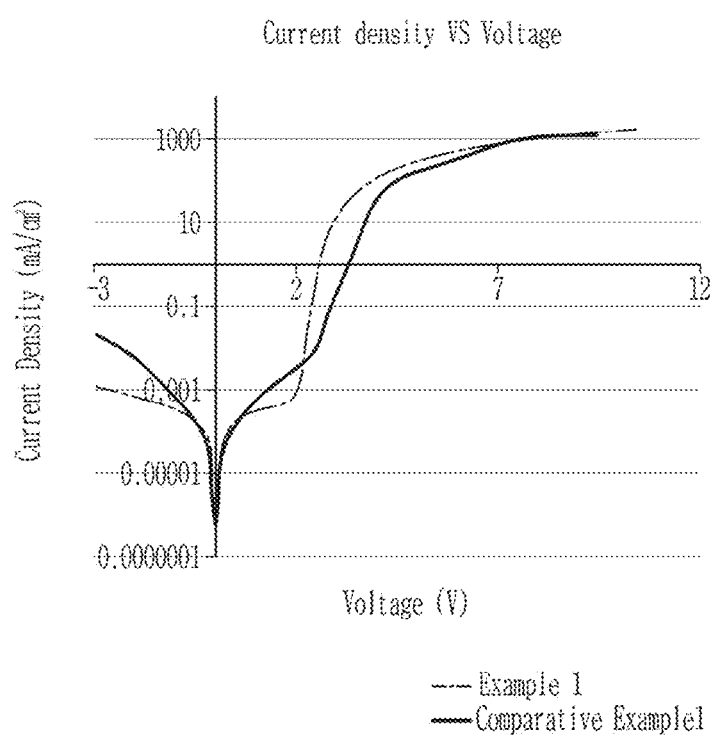
FIG. 3 is a comparative plot of current density vs. voltage of a light emitting device of Example 1 and Comparative Example 1.
Figure 4:
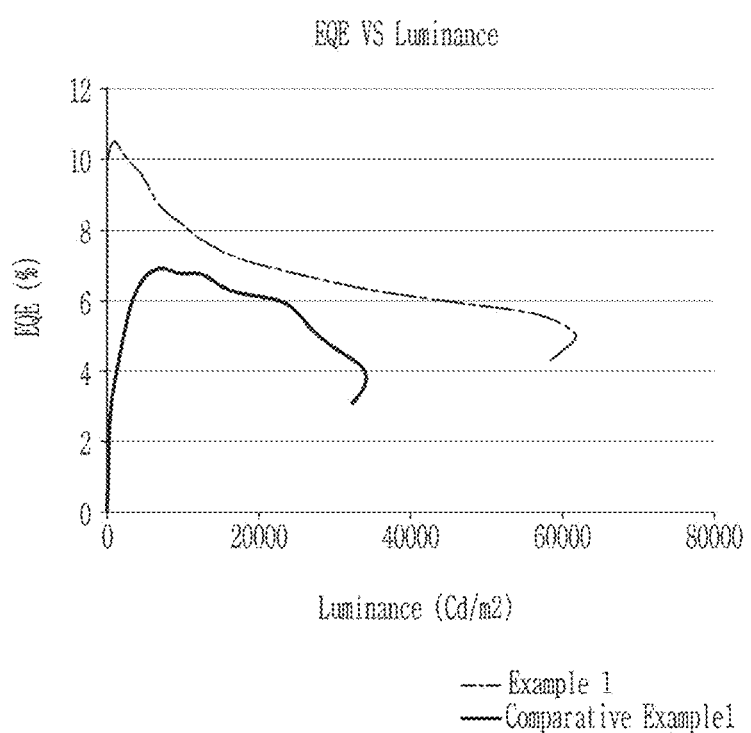
FIG. 4 is a comparative plot of quantum efficiency vs. luminance of a light emitting device of Example 1 and Comparative Example 1.
Figure 5:
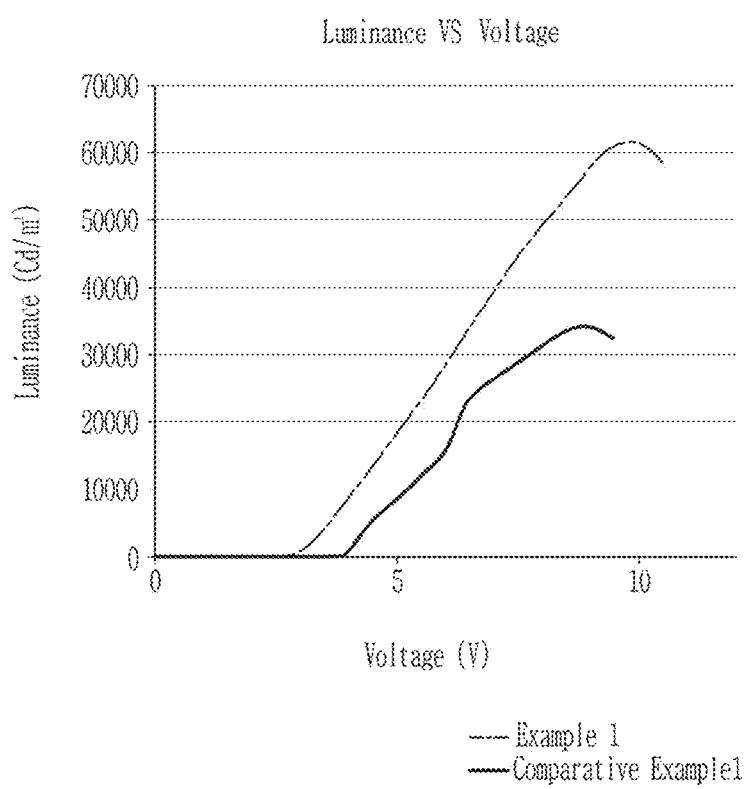
FIG. 5 is a comparative plot of luminance vs. voltage of a light emitting device of Example 1 and Comparative Example 1.
Figure 6:
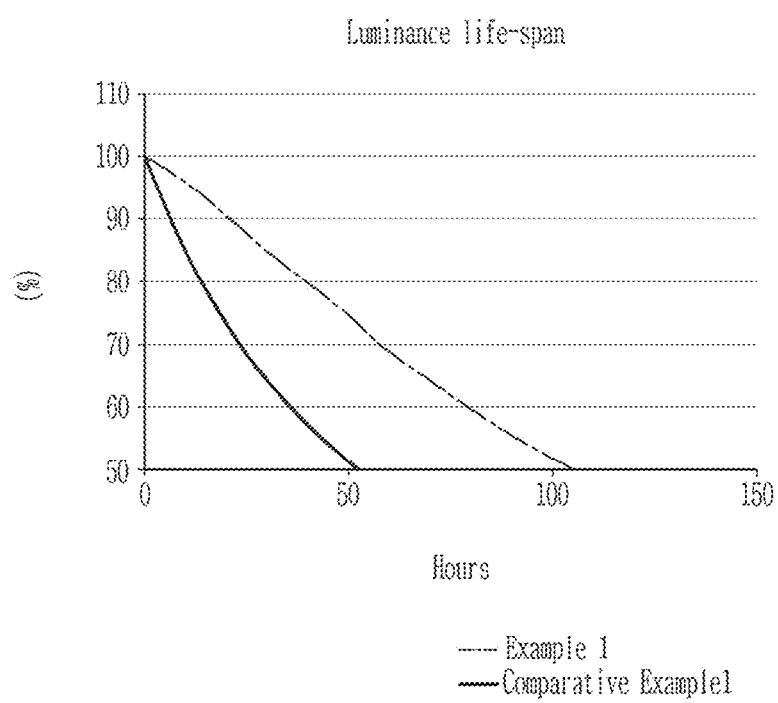
FIG. 6 is a comparative plot of luminance lifetime of a light emitting device of Example 1 and Comparative Example 1.
Figure 7:
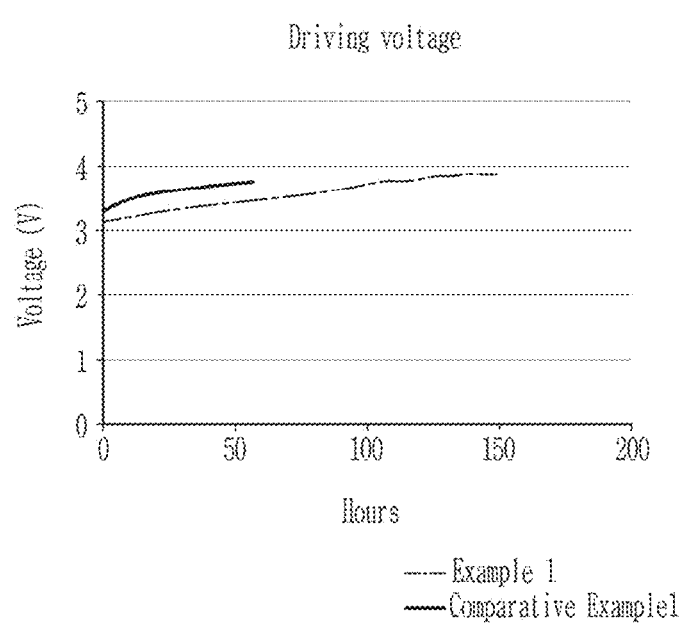
FIG. 7 is a comparative plot of driving voltage of a light emitting device of Example 1 and Comparative Example 1.
Figure 8:
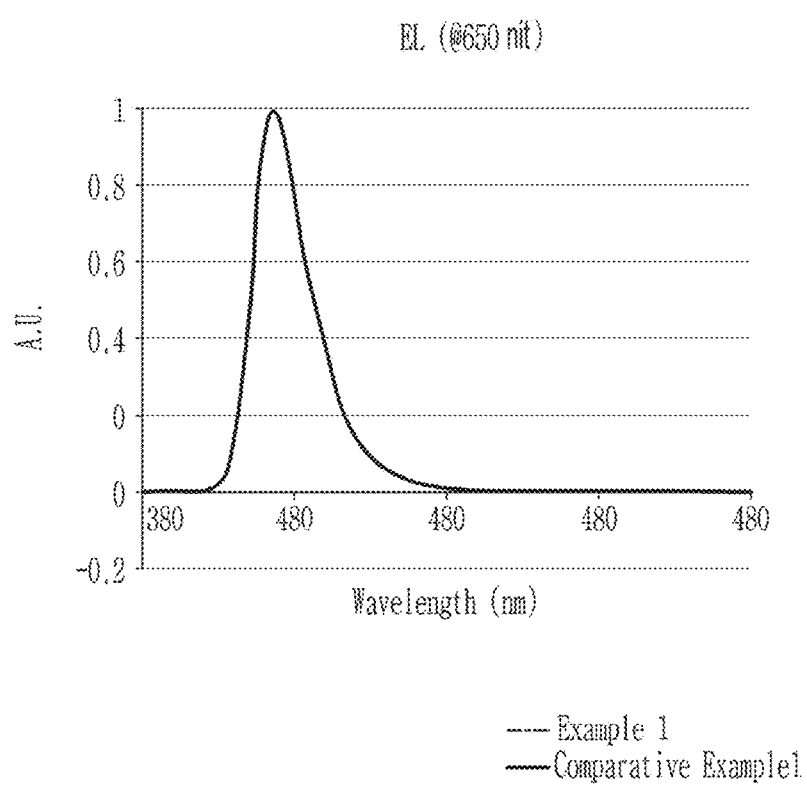
FIG. 8 is an emission plot at 650 nits of a light emitting device of Example 1 and Comparative Example 1.
Figure 9:
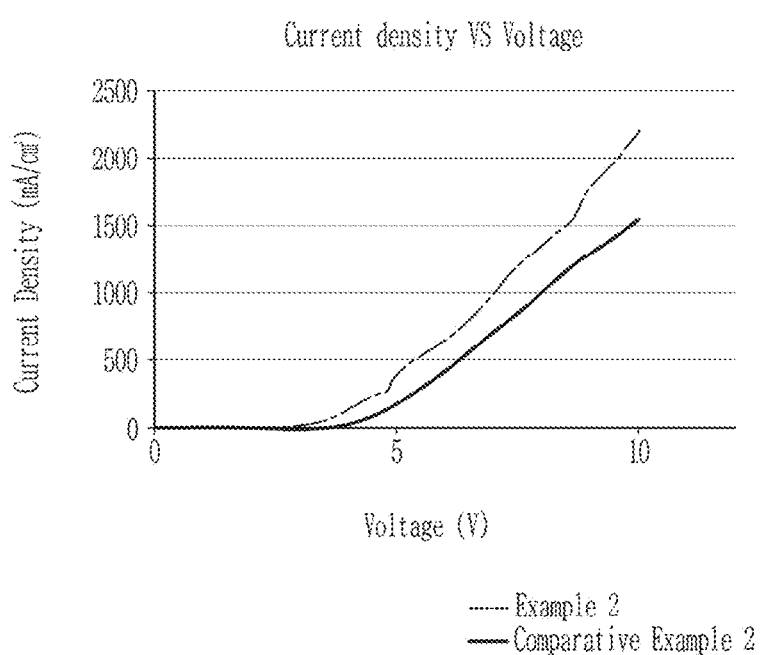
FIG. 9 is a comparative plot of current density vs. voltage of a light emitting device of Example 2 and Comparative Example 2.
Figure 10:
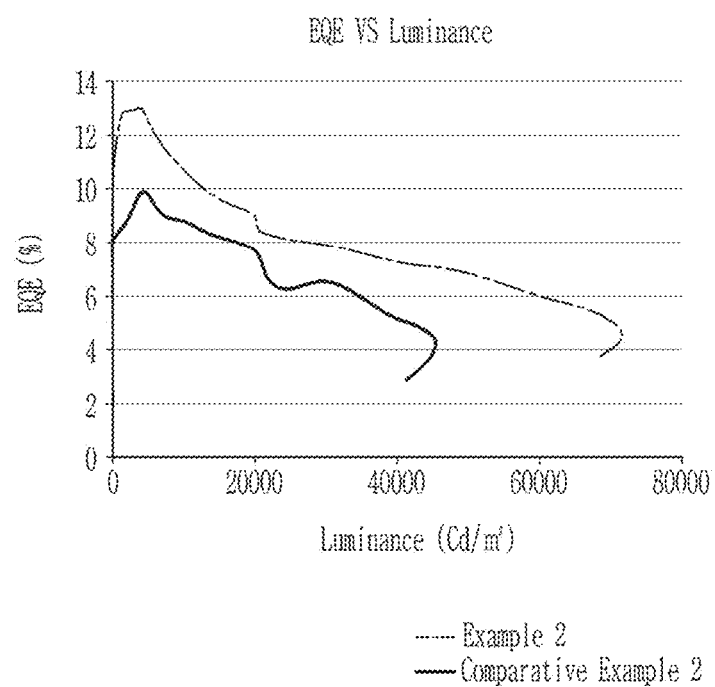
FIG. 10 is a comparative plot of quantum efficiency vs. luminance of a light emitting device of Example 2 and Comparative Example 2.
Figure 11:
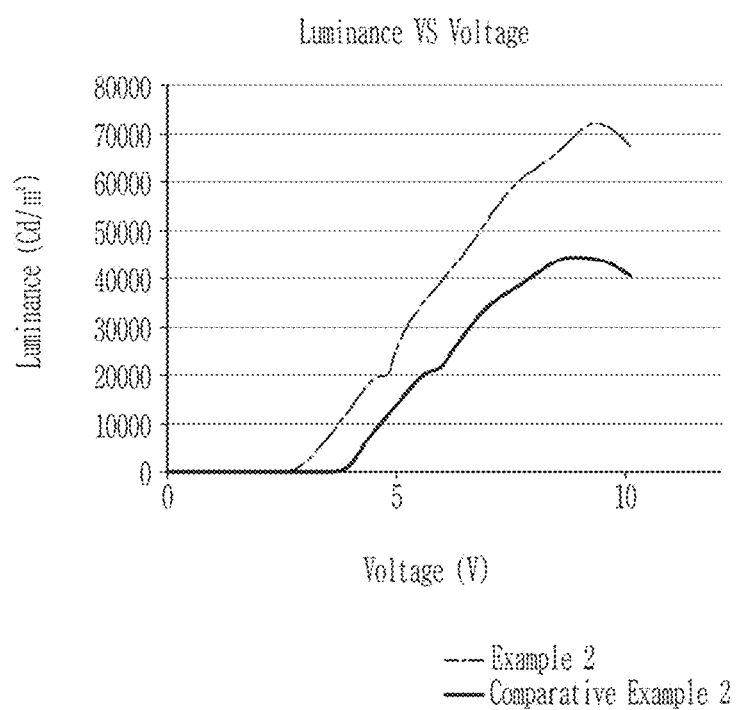
FIG. 11 is a comparative plot of luminance vs. voltage of a light emitting device of Example 2 and Comparative Example 2.
Figure 12:
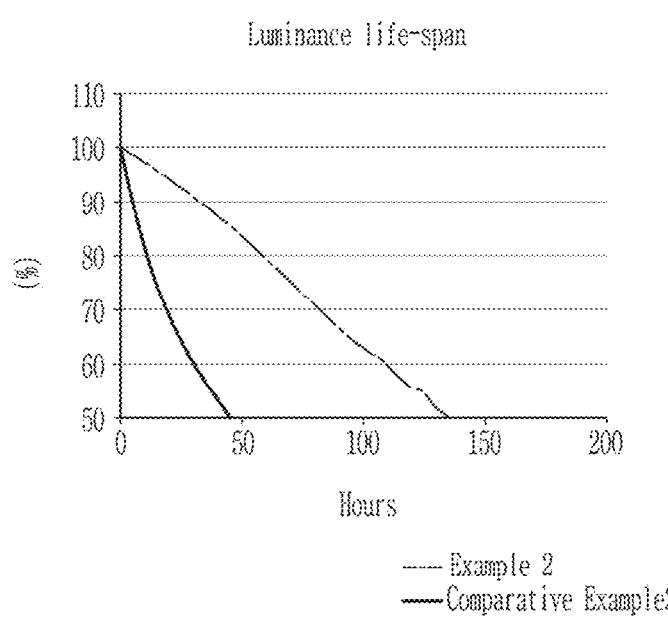
FIG. 12 is a comparative plot of luminance lifetime of a light emitting device of Example 2 and Comparative Example 2.
Figure 13:
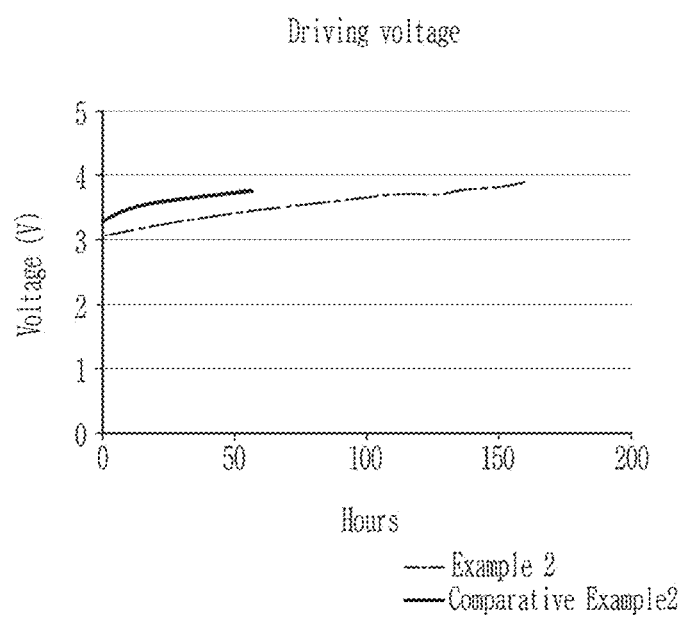
FIG. 13 is a comparative plot of driving voltage of a light emitting device of Example 2 and Comparative Example 2.
Figure 14:
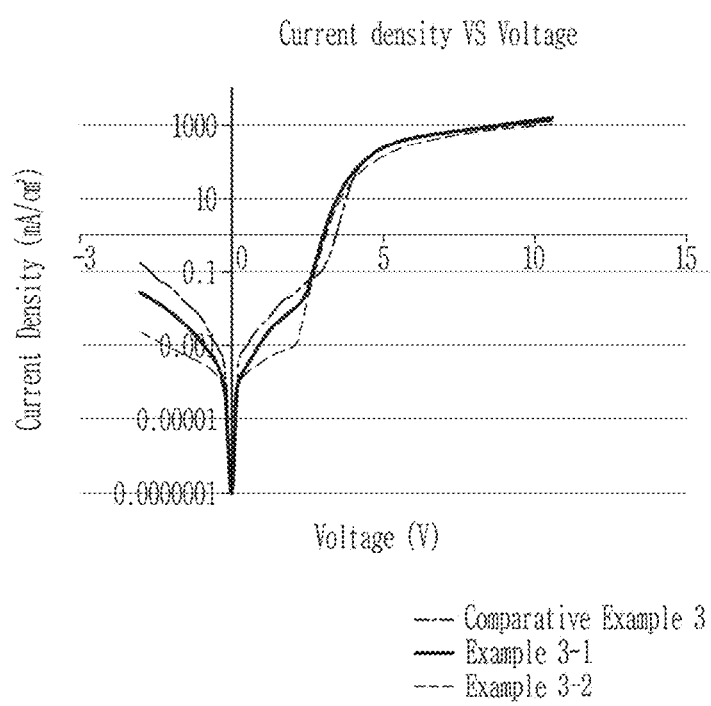
FIG. 14 is a comparative plot of current density vs. voltage of a light emitting device of Examples 3-1 and 3-2 and Comparative Example 3.
Figure 15:
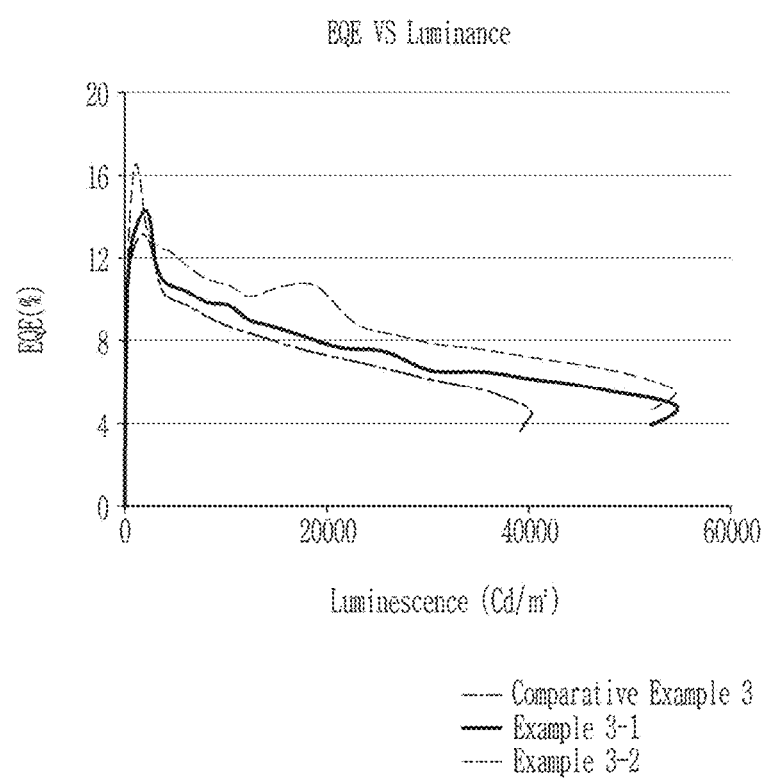
FIG. 15 is a comparative plot of quantum efficiency vs. luminance of a light emitting device of Examples 3-1 and 3-2 and Comparative Example 3.
Figure 16:
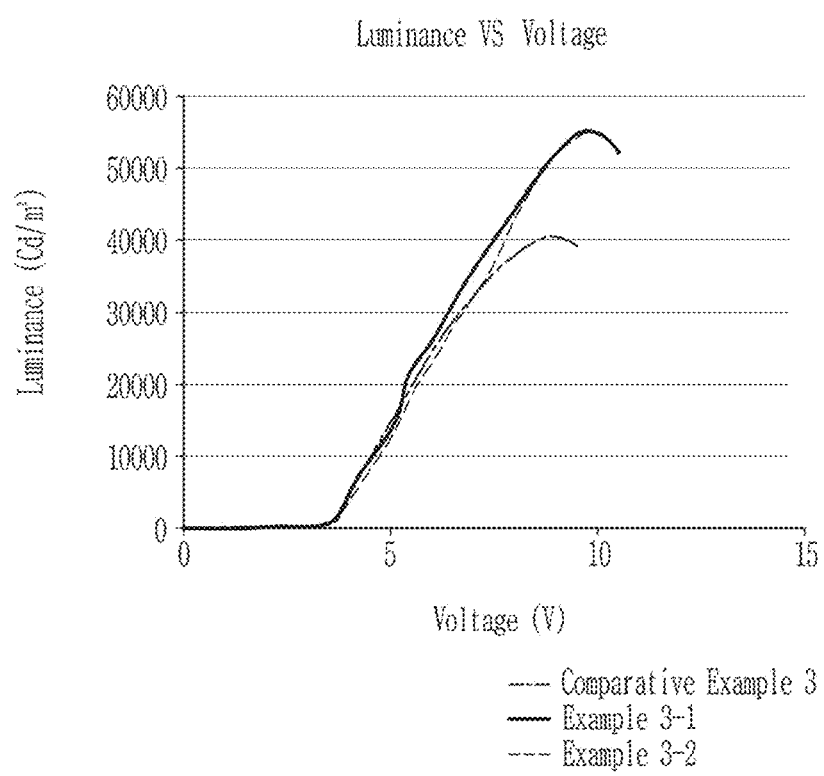
FIG. 16 is a comparative plot of luminance vs. voltage of a light emitting device of Examples 3-1 and 3-2 and Comparative Example 3.
Figure 17:
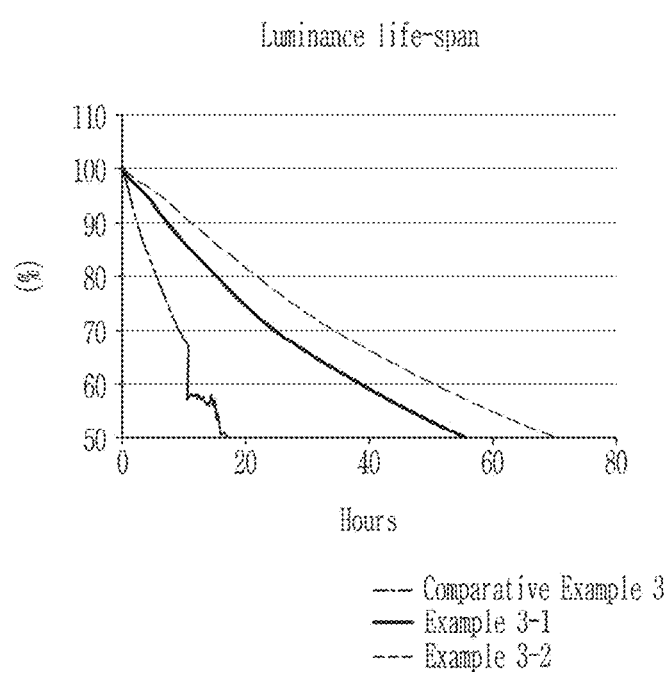
FIG. 17 is a comparative plot of luminance lifetime of a light emitting device of Examples 3-1 and 3-2 and Comparative Example 3.
Figure 18:
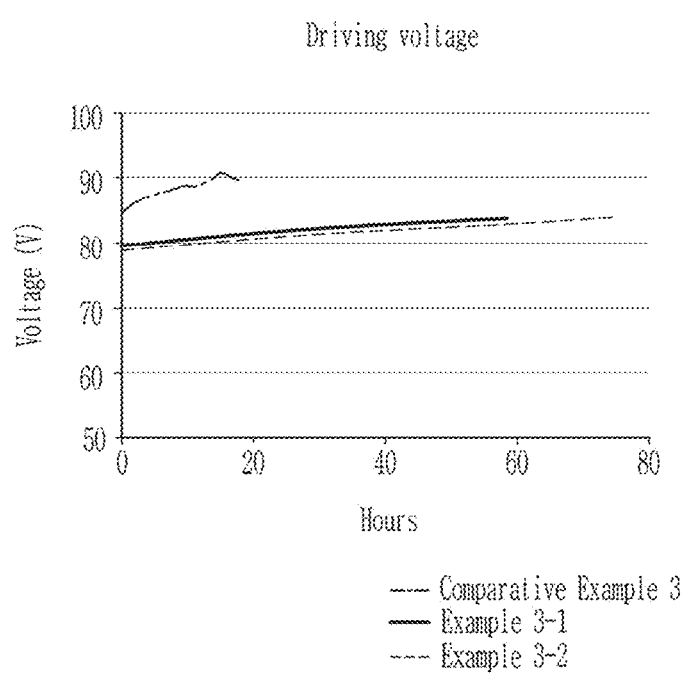
FIG. 18 is a comparative plot of driving voltage of a light emitting device of Examples 3-1 and 3-2 and Comparative Example 3.

FIG. 2 is a schematic view illustrating metal oxide nanoparticles including an anion of an organic acid included in an electron auxiliary layer of a light emitting device according to an embodiment. FIG. 2 illustrates a case where the metal oxide nanoparticles are $Zn_{1-x}Mg_xO$ (wherein $0 \leq x \leq 0.5$) (hereinafter, also referred to as ZnMgO) and the anion of the organic acid is $RCOO^-$, but the present disclosure is not limited thereto.

Referring to FIG. 2, ZnMgO nanoparticles are grown through a sol-gel dehydration condensation reaction of precursors (e.g., $Zn(CH_3COO)_2$, $Mg(CH_3COO)_2$) and a base (e.g., tetramethylammonium hydroxide, TMAH). On the surface of the synthesized nanoparticles, surface species such as $Zn^{2+}$, $Mg^{2+}$, $O^{2-}$, or —OH remain unreacted, and they act as surface defects that act as trap sites for holes when driving the light emitting device, resulting in generating a leakage current.

When the metal oxide nanoparticles are surface-treated with the organic acid on the surfaces, the nanoparticle surfaces are modified through a chemical reaction. For example, it believed that when the acid treatment is performed by using organic acid having a carboxyl group, the surface defects are passivated in an $RCOO^-$ form and thus result in removing trap sites. This contributes to increasing luminous efficiency of a light emitting device due to a hole-blocking effect of suppressing a leakage current of holes generated through the trap sites of the metal oxide nanoparticles.

In this way, the anion of the organic acid is shown to form a chemical bond with the trap sites such as metal ions on the surfaces of the metal oxide nanoparticles, or provide bonded products of the metal ions with an oxygen or hydroxyl group, or a combination thereof, which is distinguished from forming a coating layer on the surfaces of the metal oxide nanoparticles or forming an interface layer on the surface of the electron auxiliary layer 14 between the light emitting layer 13 and the electron auxiliary layer 14.

The anion of the organic acid may be present on the surface of the metal oxide nanoparticles in an amount of less than or equal to about 10 weight percent (wt %), for example, less than or equal to about 9 wt %, less than or equal to about 8 wt %, less than or equal to about 7 wt %, less than or equal to about 6 wt %, or less than or equal to about 5 wt % and greater than or equal to about 0.001 wt %, for example greater than or equal to about 0.01 wt %, greater than or equal to about 0.1 wt %, greater than or equal to about 1 wt %, greater than or equal to about 2 wt %, or greater than or equal to about 3 wt %, based on a total weight of the metal oxide nanoparticles in the electron auxiliary layer 14. It may be present on the surface of the metal oxide nanoparticles in an amount of about 0.001 wt % to about 10 wt %, for example about 0.01 wt % to about 9 wt %, about 0.1 wt % to about 8 wt %, or about 1 wt % to about 7 wt % based on a total weight of the metal oxide nanoparticles in the electron auxiliary layer 14.

A content of the anion of the organic acid may be obtained through thermogravimetric analysis (TGA) under conditions of raising the temperature to 600° C. at a rate of 10.00° C./min using TGA Q5000 as an example. In addition, when the electron auxiliary layer 14 further includes the electron injection layer or the hole blocking layer in addition to the electron transport layer, the content of the anion of the organic acid may be measured based on the electron transport layer alone.

In addition, it is possible to obtain an effect of improving the conductivity of the ZnMgO nanoparticles as organic substances or materials on the surface of the ZnMgO nanoparticles are desorbed through the organic acid treatment. The desorbed organic substances may be removed by washing with an organic solvent used for the acid treatment.

Accordingly, the electron auxiliary layer 14 has a mole ratio of the carbon atoms to all metal atoms of the metal oxide nanoparticles of less than or equal to about 1.3:1, for example less than or equal to about 1.2:1, less than or equal to about 1.1:1, less than or equal to about 1.0:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, or even 0.

The mole ratio of the carbon atoms to all the metal atoms in the electron auxiliary layer 14 may be measured by X-ray photoelectron spectroscopy (XPS) analysis under the conditions of an acceleration voltage of about 0.5 keV to about 15 keV, about 300 W, and a minimum analysis area of $200 \times 200$ $\mu m^2$ using a Quantum 2000 device of Physical Electronics, Inc. In addition, when the electron auxiliary layer 14 further includes the electron injection layer or the hole blocking layer in addition to the electron transport layer, the mole ratio of carbon atoms to all metal atoms may be measured based on the electron transport layer alone.

As an example, the organic substances may be basic substances used when growing the metal oxide nanoparticles by a sol-gel dehydration condensation reaction, for example tetramethylammonium hydroxide (TMAH), potassium hydroxide (KOH), sodium hydroxide (NaOH), lithium hydroxide (LiOH), or a combination thereof.

A content of a basic material in the metal oxide nanoparticles may be less than or equal to about 2 wt %, for example, less than or equal to about 1.9 wt %, less than or equal to about 1.8 wt %, less than or equal to about 1.7 wt %, less than or equal to about 1.6 wt %, less than or equal to about 1.5 wt %, less than or equal to about 1.4 wt %, less than or equal to about 1.3 wt %, less than or equal to about 1.2 wt %, less than or equal to about 1.1 wt %, less than or equal to about 1.0 wt %, less than or equal to about 0.9 wt %, less than or equal to about 0.8 wt %, less than or equal to about 0.7 wt %, less than or equal to about 0.6 wt %, less than or equal to about 0.5 wt %, less than or equal to about 0.4 wt %, less than or equal to about 0.3 wt %, less than or equal to about 0.2 wt %, less than or equal to about 0.1 wt %, or even less, based on a total weight of the metal oxide nanoparticles in the electron auxiliary layer. In an embodiment, 0 wt % of a basic material is present based on a total weight of the metal oxide nanoparticles in the electron auxiliary layer.

A content of the basic material may be determined by thermogravimetric analysis (TGA) under conditions of raising the temperature to 600° C. at a rate of 10.00° C./min using TGA Q5000 as an example. In addition, when the electron auxiliary layer 14 further includes the electron injection layer or the hole blocking layer in addition to the electron transport layer, the content of the basic material may be measured based on the electron transport layer alone. In an embodiment, 0 wt % of a basic material is present based on a total weight of the metal oxide nanoparticles in the electron auxiliary layer, as determined using TGA under the foregoing conditions.

In this way, and without being bound by theory, as the content of organic substances such as the basic material acting as an insulator on the surface of the metal oxide nanoparticles decreases, the interface charging between the light emitting layer 13 including the quantum dots and the electron auxiliary layer 14 may be removed to decrease deterioration and increase life span.

Accordingly, an electrical conductivity of the electron auxiliary layer 14 may be greater than about $6.5 \times 10^{-8}$ siemens per centimeter (S/cm), for example, greater than about $7.0 \times 10^{-8}$ S/cm, greater than about $8.0 \times 10^{-8}$ S/cm, greater than about $8.5 \times 10^{-8}$ S/cm, greater than about $9.0 \times 10^{-8}$ S/cm, greater than about $9.5 \times 10^{-8}$ S/cm, or greater than about $10.0 \times 10^{-8}$ S/cm, and less than about 1.0 S/cm, for example less than about 0.1 S/cm, less than about $1.0 \times 10^{-2}$ S/cm, or less than about $1.0 \times 10^{-3}$ S/cm. It may be greater than about $6.5 \times 10^{-8}$ S/cm and less than about $1.0 \times 10^{-3}$ S/cm, for example greater than about $7.0 \times 10^{-8}$ S/cm and less than about $1.0 \times 10^{-3}$ S/cm, greater than about $7.5 \times 10^{-8}$ S/cm and less than about $1.0 \times 10^{-3}$ S/cm, greater than about $8.0 \times 10^{-8}$ S/cm and less than about $1.0 \times 10^{-3}$ S/cm, greater than about $8.5 \times 10^{-8}$ S/cm and less than about $1.0 \times 10^{-3}$ S/cm, greater than about $9.0 \times 10^{-8}$ S/cm and less than about $1.0 \times 10^{-3}$ S/cm, greater than about $9.5 \times 10^{-8}$ S/cm and less than about $1.0 \times 10^{-3}$ S/cm, or greater than about $10.0 \times 10^{-8}$ S/cm and less than about $1.0 \times 10^{-3}$ S/cm. In addition, when the electron auxiliary layer 14 further includes the electron injection layer or the hole blocking layer in addition to the electron transport layer, the electrical conductivity may be the electrical conductivity of the electron transport layer.

Meanwhile, when the surface of the metal oxide nanoparticles is modified with the organic acid, crystal growth of the metal oxide nanoparticles is facilitated at or near the surface defect portion so that the crystallinity of the metal oxide nanoparticles may increase.

A thickness of the electron auxiliary layer 14 may be appropriately selected in consideration of the emission wavelength of the quantum dots, the thickness of light emitting layer 13, the type and thickness of the hole auxiliary layer 12, and the like. For example, the quantum dots in the light emitting layer 13 may emit light having a center wavelength of about 600 nm to about 640 nm and the electron auxiliary layer 14 may have a thickness of greater than or equal to about 20 nm, for example, greater than or equal to about 25 nm, greater than or equal to about 30 nm, greater than or equal to about 35 nm, greater than or equal to about 40 nm, or greater than or equal to about 45 nm and less than or equal to about 80 nm, for example, less than or equal to about 75 nm, less than or equal to about 70 nm, less than or equal to about 65 nm, less than or equal to about 60 nm, or less than or equal to about 55 nm. For example, the quantum dots in the light emitting layer 13 may emit light having a center wavelength of less than or equal to about 500 nm and the electron auxiliary layer 14 may have a thickness of greater than or equal to about 60 nm, for example, greater than or equal to about 65 nm, greater than or equal to about 70 nm, or greater than or equal to about 75 nm and less than or equal to about 120 nm, for example, less than or equal to about 115 nm, less than or equal to about 110 nm, less than or equal to about 105 nm, less than or equal to about 100 nm, less than or equal to about 95 nm, or less than or equal to about 90 nm.

The light emitting device 10 may have a maximum external quantum efficiency ($EQE_{Max}$) of greater than or equal to about 10%, for example greater than or equal to about 11%, greater than or equal to about 12%, greater than or equal to about 13%, greater than or equal to about 14%, greater than or equal to about 15%, greater than or equal to about 16%, or greater than or equal to about 17%. In addition, the light emitting device may have luminance of greater than or equal to about 50,000 nit, for example greater than or equal to about 54,000 nit, greater than or equal to about 61,000 nit, greater than or equal to about 64,000 nit, or greater than or equal to about 71,000 nit.

Another embodiment relates to a method of manufacturing the aforementioned light emitting device.

The manufacturing method includes forming an electron auxiliary layer including metal oxide nanoparticles, and contacting the electron auxiliary layer with an organic acid or a solution including an organic acid.

The method of manufacturing the light emitting device may further include forming the first electrode and the second electrode, the light emitting layer including quantum dots, or optionally the hole auxiliary layer.

A method of forming the electron auxiliary layer including the metal oxide nanoparticles may be appropriately selected and is not particularly limited. The electron auxiliary layer including the metal oxide nanoparticles may be formed by a solution process, for example, spin coating, bar coating, spray coating, slit coating, inkjet printing, nozzle printing, spraying, or doctor blade coating, but is not limited thereto.

The contacting of the electron auxiliary layer with the organic acid or a solution including the organic acid may include coating the electron auxiliary layer with the organic acid or the solution including the organic acid, or dipping the electron auxiliary layer in the organic acid or the solution including the organic acid. The contacting of the electron auxiliary layer with the organic acid or a solution including the organic acid may be conducted using a simple solution process, which is also the method that may be used to form the electron auxiliary layer.

The method of coating the electron auxiliary layer with an organic acid or a solution including the organic acid may be conducted by spin coating, bar coating, spray coating, slit coating, inkjet printing, nozzle printing, spraying, or doctor blade coating, but is not limited thereto.

The solution including the organic acid may include a solvent capable of dissolving the organic acid including water, acetone, alcohol, ether, ethyl acetate, dimethylsulfoxide (DMSO), or a combination thereof.

Another embodiment provides a display device including the aforementioned light emitting device.

However, the light emitting device is not limited to being applied to the display device (e.g., as QD-LED), and may be applied to a biological labeling (biosensor, bio-imaging), a photodetector, or a solar cell (e.g., a QD photoelectric device).

Hereinafter, specific embodiments of the present disclosure are presented. However, the examples described below are for illustrative purposes only, and the scope of the present disclosure is not limited thereto. Analysis Methods
[1] Electroluminescence Spectroscopy Electroluminescence properties are evaluated using a Keithley 2200 source measuring equipment and a Minolta CS2000 spectroradiometer (current-voltage-luminance measuring equipment).
[2] Infrared Spectroscopy (IR)

IR analysis is performed using Agilent's Varian 670-IR (Harrick Seagull variable angle accessory) under conditions of 4000-650 $cm^{-1}$ range, over 128 scans, Ge crystal, incident angle of 64° in internal reflection (Hemisphere ATR) mode.
[3] Gas Chromatography (GC) Analysis A GC analysis is performed using Agilent's GC-MS (pyrolyzer), 7890B, 5977A, pyrolyzer: 450° C., Column: 30 m×0.25 mm×0.25 mm (UA5), flow: He (1 mL/min), Inlet temp: 300° C., Oven temp: 50° C. (2 min), 20° C./min, 320° C. (10 min), analyzer: quadrupole (range: 10 m/z to 550 m/z).

[4] Selective Area Diffraction Pattern (SADP) Analysis

An SADP analysis is performed using JEOL's ARM 200F.

Manufacture of Light Emitting Device

Preparation Example 1

(1) Preparation of ZnTeSe Core

Selenium and tellurium are dispersed in trioctylphosphine (TOP) to obtain a 2 M Se/TOP stock solution and a 2 M Te/TOP stock solution. A trioctylamine solution including 0.125 millimoles (mmol) of zinc acetate and 0.25 mmol of palmitic acid is prepared in a 400 milliliters (mL) reaction flask. The solution is heated at 120° C. under vacuum for 1 hour, then nitrogen gas is added to the reaction flask, and the reaction flask is heated to 300° C. The prepared Se/TOP stock solution and Te/TOP stock solution are rapidly added to the reaction flask, and the obtained mixture is reacted for 1 hour at 300° C. When the reaction is complete, the reaction solution is cooled to room temperature, acetone is added to the flask, and resulting precipitate is separated with a centrifuge and dispersed in toluene.

(2) Preparation of Blue Light Emitting ZnTeSe/ZnSeS Core/Shell Semiconductor Nanocrystal 0.9 mmol of zinc acetate, 1.8 mmol of oleic acid, and 10 mL of trioctylamine are added to a reaction flask and heated at 120° C. under vacuum for 10 minutes. Nitrogen gas is added to the reaction flask and the flask is heated to 280° C. Subsequently, the prepared toluene dispersion of a ZnTeSe core (OD, optical density of 1st excitonic absorption, OD=0.45) is added to the reaction flask within 10 seconds followed by the addition of 0.6 mmol of Se/TOP and 2.0 mmol of S/TOP, and the mixture is reacted for 120 minutes at 280° C. to prepare a (crude) reaction solution. When the reaction is complete, the reaction solution is rapidly cooled to room temperature (24° C.), ethanol is added, and the resulting precipitate is separated with a centrifuge and re-dispersed in cyclohexane to prepare a ZnTeSe/ZnSeS semiconductor nanocrystal.

Preparation Example 2

3.06 mmol of zinc acetate dihydrate, 0.54 mmol of magnesium acetate tetrahydrate, and 30 mL of dimethylsulfoxide are put into a reactor and dissolved therein. Subsequently, 5.5 mmol of tetramethylammonium hydroxide (TMAH) pentahydrate is dissolved in 10 mL of ethanol, and the solution is put into the above reactor. The mixture is stirred for 1 hour to prepare $Zn_{0.85}Mg_{0.15}O$ nanoparticles (an average particle diameter: about 3 nanometers (nm)). The $Zn_{0.85}Mg_{0.15}O$ nanoparticles are mixed with ethyl acetate in a volume ratio of 1:4 and the obtained mixture is centrifuged and the resultant is dispersed in ethanol to obtain a ZnMgO solution for an electron transport layer.

Examples 1 to 3

To a glass substrate deposited with ITO (as an anode) and surface-treated with UV-ozone for 15 minutes, a PEDOT:PSS solution (H.C. Starks GmbH) is spin-coated and heat-treated at 150° C. for 30 minutes to form a 30 nm-thick hole injection layer (HIL). A solution including poly[(9,9-dioctylfluoren-2,7-diyl-co-(4,4'-(N-4-butylphenyl)-diphenylamine] (TFB) (Sumitomo Corp.) is then spin-coated on the hole injection layer (HIL), and the coated substrate is heat-treated at 150° C. for 30 minutes to form a 25 nm-thick hole transport layer (HTL). A quantum dot light emitting layer that emits light at a wavelength of 465 nm is formed on the HTL and heat-treated at 80° C. for 30 minutes under a nitrogen atmosphere. A ZnMgO solution for an electron transport layer (ETL) is spin-coated on the quantum dot light emitting layer and heat-treated at 80° C. for 30 minutes.

An organic acid (Example 1: citric acid, Example 2: acetic acid, Example 3: oxalic acid) is dissolved in ethanol, and the solution is spin-coated on the electron transport layer (ETL), and then, dried at room temperature for 1 hour under a nitrogen atmosphere. An aluminum electrode patterned into an electrode shape is vacuum-deposited as an upper cathode to manufacture a quantum dot light emitting device.

Comparative Example 1

A quantum dot light emitting device is manufactured according to the method of Example 1 except that after forming the quantum dot light emitting layer, the spin-coating process of the solution including an organic acid is not performed.

Comparative Example 2

A quantum dot light emitting device is manufactured according to the method of Example 2 except that after forming the quantum dot light emitting layer, the spin-coating process of the solution including an organic acid is not performed.

Comparative Example 3

A quantum dot light emitting device is manufactured according to the method of Example 3 except that after forming the quantum dot light emitting layer, the spin-coating process of the solution including an organic acid is not performed.

Experimental Example 1: Evaluation of Characteristics of Light Emitting Devices Manufactured in Example 1 and Comparative Example 1

For the quantum dot light emitting devices manufactured in Example 1 and Comparative Example 1, electroluminescence properties are evaluated using a Keithley 2200 source measuring equipment and a Minolta CS2000 spectroradiometer (current-voltage-luminance measuring equipment).

A voltage is applied to the light emitting device, and luminance, and electroluminescence (EL) are measured with the current-voltage-luminance measuring equipment, and an external quantum efficiency is calculated. The results are shown in FIGS. 3 to 8.

FIGS. 3 to 8 are comparative plots showing measurement results of the current density according to a voltage, external quantum efficiency according to luminance, luminance according to a voltage, luminance life-span, a life-span driving voltage, and electroluminescence (EL) spectra of the light emitting devices of Example 1 and Comparative Example 1. In addition, the light emitting life-span characteristics of the quantum dot light emitting devices are also measured. The results are listed in Table 1.

TABLE 1

|  | Example 1 | Comparative Example 1 |
|---|---|---|
| $EQE_{max}$ (%) [1] | 10.5 | 6.9 |
| $Lum._{max}$ (Cd/m$^2$) [2] | 61209 | 34117 |

TABLE 1-continued

|  | Example 1 | Comparative Example 1 |
|---|---|---|
| EQE (@10000 nit) | 8.2 | 6.8 |
| Cd/A$_{max}$ | 12.0 | 5.8 |
| V (@5 mA/cm$^2$) | 2.8 | 3.6 |
| V (@1000 nit) | 2.9 | 3.9 |
| T50 (hr)[3](ini@650 nit) | 105 | 53 |
| Lamda$_{max}$ (nm)[4] | 465 | 465 |
| FWHM (nm)[5] | 42 | 42 |

[1] EQE$_{max}$ (%): maximum external quantum efficiency
[2] Lum.$_{max}$ (Cd/m$^2$): maximum luminance
[3] T50 (hr): time (hr) taken until luminance is reduced down to 50% based on 100% of initial luminance
[4] λ$_{max}$ (nm): emission spectrum maximum light emitting wavelength
[5] FWHM (nm): emission spectrum full width at half maximum (FWHM)

Referring to FIGS. 3 to 8 and Table 1, the light emitting device of Example 1 exhibits improved efficiency from 6.9% to 10.5%, improved luminance from about 34000 nit to about 61000 nit, and an increased life-span (T50) from about 53 hr to about 105 hr, compared to the light emitting device of Comparative Example 1.

Experimental Example 2: Evaluation of Characteristics of Light Emitting Devices Manufactured in Example 2 and Comparative Example 2

Electroluminescence properties of the quantum dot light emitting devices according to Example 2 and Comparative Example 2 are evaluated according to the same method as in Experimental Example 1.

FIGS. 9 to 13 are comparative plots showing measurement results of the current density according to a voltage, external quantum efficiency according to luminance, luminance according to a voltage, luminance life-span, and a life-span driving voltage of the light emitting devices of Example 2 and Comparative Example 2. In addition, light emitting life-span characteristics of the quantum dot light emitting devices are measured. The results are listed in Table 2.

TABLE 2

|  | Example 2 | Comparative Example 2 |
|---|---|---|
| EQE$_{max}$ (%) | 13.1 | 9.8 |
| Lum.$_{max}$ (Cd/m$^2$) | 71453 | 45069 |
| EQE (@10000 nit) | 10.9 | 8.9 |
| Cd/A$_{max}$ | 15.1 | 10.0 |
| V (@5 mA/cm$^2$) | 2.7 | 3.8 |
| V (@1000 nit) | 2.8 | 3.9 |
| T50 (hr) (ini@650 nit) | 136 | 46 |

Referring to FIGS. 9 to 13 and Table 2, the light emitting device according to Example 2 exhibits improved efficiency from 9.8% to 13.1%, improved luminance from about 45000 nit to about 71000 nit, and an increased life-span (T50) from 46 hr to 136 hr, compared to the light emitting device according to Comparative Example 2.

Experimental Example 3: Evaluation of Characteristics of Light Emitting Devices Manufactured in Example 3 and Comparative Example 3

Electroluminescence properties of the quantum dot light emitting devices according to Example 3 and Comparative Example 3 are evaluated according to the same method as in Experimental Example 1. Herein, the content of oxalic acid in the organic acid solution is increased to 10 times to conduct an additional experiment, which is respectively marked as Example 3-1 (the content of oxalic acid×1) and Example 3-2 (the content of oxalic acid×10).

FIGS. 14 to 18 are comparative plots showing measurement results of the current density according to a voltage, external quantum efficiency according to luminance, luminance according to a voltage, luminance life-span, and a life-span driving voltage of the light emitting devices of Example 3-1, Example 3-2, and Comparative Example 3. In addition, light-emitting life-span characteristics of the quantum dot light emitting devices are also measured. The results are listed in Table 3.

TABLE 3

|  | Example 3-1 | Example 3-2 | Comparative Example 3 |
|---|---|---|---|
| EQE$_{max}$ (%) | 14.2 | 16.5 | 13.1 |
| Lum.$_{max}$ (Cd/m$^2$) | 54900 | 54600 | 40470 |
| EQE (@10000 nit) | 9.7 | 10.7 | 8.8 |
| Cd/A$_{max}$ | 13.5 | 16.6 | 11.9 |
| V (@1 nit) | 2.4 | 2.4 | 2.8 |
| T50 (hr) (ini@650 nit) | 56 | 71 | 16 |

Referring to FIGS. 14 to 18 and Table 3, the light emitting device according to Example 3-2 exhibits improved efficiency from 13.1% to 16.5%, improved luminance from about 40500 nit to about 55000 nit, and an increased life-span (T50) from 16 hr to 71 hr, compared to the light emitting device according to Comparative Example 3.

Experimental Example 4: Evaluation of SADP Analysis for Electron Auxiliary Layer An SADP analysis is conducted with respect to metal oxide nanoparticles included in the electron auxiliary layers of the light emitting devices according to Examples 1 and 2 and Comparative Example 1, and the results are shown in FIG. 19. In FIG. 19, as the intensities of the patterns are stronger, the crystallinity of the metal oxide particles is shown to be greater.

Experimental Example 5: Evaluation of IR and GC Analyses for Electron Auxiliary Layer An IR analysis is performed with respect to the electron auxiliary layers of the light emitting devices according to Example 2 and Comparative Example 2, and the results are shown in FIG. 20.

In addition, a GC analysis is performed with respect to the electron auxiliary layers of the light emitting devices according to Example 2 and Comparative Example 2, and the results are shown in FIG. 21. In FIG. 21, the bottom graph shows the result of the light emitting device according to Example 2, and the top graph shows the result of the light emitting device according to Comparative Example 2.

Figure 20:
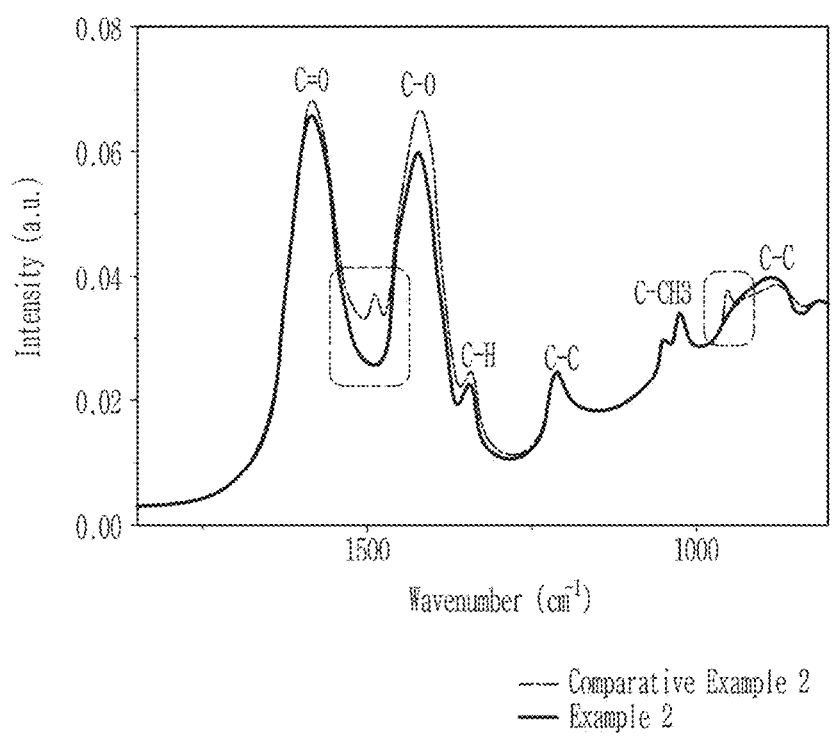
FIG. 20 is a comparative plot of infrared spectroscopy (IR) analysis on the electron auxiliary layer of Example 2 and Comparative Example 2 in accordance with Experimental Example 5.

Referring to FIG. 20, Example 2 exhibits a reduced content of TMAH (N—CH$_3$) around 1486 cm$^{-1}$ and about 945 cm$^{-1}$ due to the organic acid treatment, compared with Comparative Example 2.

In addition, referring to FIG. 21, Example 2 exhibits presence of the acetic acid or methyl ester in the range of about 2 min to about 2.1 min and around about 2.4 min respectively due to the organic acid treatment, compared with Comparative Example 2.

Experimental Example 6: Evaluation of Content of Organic Substances of Electron Auxiliary Layer X-ray photoelectron spectroscopy (XPS) is performed with respect to the electron auxiliary layers of the light emitting devices according to Example 1 and Comparative Example 1 by using a Quantum2000 made by Physical Electronics, Inc. under conditions of an acceleration voltage of 0.5 keV to 15 keV, 300 W, and a minimum analysis area of 200×200 square micrometers ($\mu m^2$) to determine a mole ratio of carbon atoms to metal atoms, the results of which are shown in Table 4.

TABLE 4

|  | C | O | Mg | Zn | C:(Mg + Zn) |
|---|---|---|---|---|---|
| Comparative Example 1 | 31.32 | 45.43 | 5.72 | 17.53 | 1.347 |
| Example 1 | 25.97 | 44.24 | 3.64 | 25.00 | 0.907 |

Referring to Table 4, because the electron auxiliary layer is treated with a solution including organic acid to desorb organic substances including a basic material, e.g., TMAH, and the like on surfaces of the metal oxide nanoparticles, and then the layer is washed to remove the desorbed substances with an organic solvent used in the acid treatment, Example 1 exhibits a mole ratio of carbon atoms relative to metal atoms, i.e., Zn and Mg, of less than or equal to 1.3:1.

In addition, XPS analysis of the surface-modified metal oxide particle of Example 1 shows a higher mole ratio of Zn:Mg than that of Comparative Example 1.

While this disclosure has been described in connection with what is presently considered to be practical example embodiments, it is to be understood that the present disclosure is not limited to the disclosed embodiments. On the contrary, it is intended to cover various modifications and equivalent arrangements included within the spirit and scope of the appended claims.

DESCRIPTION OF SYMBOLS

- 10: light emitting device
- 11: first electrode
- 12: hole auxiliary layer
- 13: light emitting layer
- 14: electron auxiliary layer
- 15: second electrode

What is claimed is:

1. A light emitting device, comprising
a first electrode and a second electrode, each having a surface opposite the other,
a light emitting layer disposed between the first electrode and the second electrode, wherein the light emitting layer comprises quantum dots, and
an electron auxiliary layer disposed between the light emitting layer and the second electrode,
wherein the electron auxiliary layer comprises metal oxide nanoparticles including an anion of an organic acid bound to a surface of the metal oxide nanoparticle, and the anion of the organic acid comprises citrate ion, acetate ion, oxalate ion, sulfonate ion, or a combination thereof.

2. The light emitting device of claim 1, wherein the anion of the organic acid is chemically bonded with a metal ion at a surface of the metal oxide nanoparticles, or provides a bonded product of the metal ion and oxygen or a hydroxyl group, or a combination thereof.

3. The light emitting device of claim 1, wherein the anion of the organic acid is present on a surface of the metal oxide nanoparticles in an amount of about 0.001 weight percent to about 10 weight percent based on a total weight of the metal oxide nanoparticles in the electron auxiliary layer.

4. The light emitting device of claim 1, wherein the electron auxiliary layer has a mole ratio of carbon atoms to all metal atoms of the metal oxide nanoparticles of less than or equal to about 1.3:1.

5. The light emitting device of claim 1, wherein a content of a basic material in the metal oxide nanoparticles is less than or equal to about 2 weight percent based on a total weight of the metal oxide nanoparticles in the electron auxiliary layer.

6. The light emitting device of claim 5, wherein the basic material is present, and comprises tetramethyl ammonium hydroxide, potassium hydroxide, sodium hydroxide, lithium hydroxide, or a combination thereof.

7. The light emitting device of claim 1, wherein the electron auxiliary layer has an electrical conductivity of greater than about $6.5 \times 10^{-8}$ siemens per centimeter.

8. The light emitting device of claim 1, wherein the metal oxide comprises Zn, Mg, Ca, Zr, W, Li, Ti, Y, Al, or a combination thereof.

9. The light emitting device of claim 1, wherein the metal oxide is represented by Chemical Formula 1:

$$Zn_{1-x}M_xO \quad \text{Chemical Formula 1}$$

wherein, in Chemical Formula 1,
M is Mg, Ca, Zr, W, Li, Ti, Y, Al, or a combination thereof, and
$0 \leq x \leq 0.5$.

10. The light emitting device of claim 1, wherein the metal oxide comprises zinc oxide, zinc magnesium oxide, or a combination thereof.

11. The light emitting device of claim 1, wherein the metal oxide nanoparticles have an average particle size of greater than or equal to about 1 nanometer and less than or equal to about 100 nanometer.

12. The light emitting device of claim 1, wherein the light emitting device further comprises a hole auxiliary layer including a hole injecting layer, a hole transporting layer, an electron blocking layer, or a combination thereof, disposed between the first electrode and the light emitting layer.

13. The light emitting device of claim 1, wherein the light emitting device has a maximum external quantum efficiency of greater than or equal to about 10%, and a luminance of greater than or equal to about 50,000 nit.

14. A method of manufacturing a light emitting device of claim 1, comprising
forming the electron auxiliary layer including the metal oxide nanoparticles; and
contacting the electron auxiliary layer with the organic acid or a solution including the organic acid.

15. The method of claim 14, wherein the contacting of the electron auxiliary layer with the organic acid or the solution including the organic acid comprises coating the electron auxiliary layer with the organic acid or the solution including the organic acid, or dipping the electron auxiliary layer in the organic acid or in the solution including the organic acid.

16. The method of claim 15, wherein the coating comprises spin coating, bar coating, spray coating, slit coating, ink jet printing, nozzle printing, spraying, or doctor blade coating.

17. A display device comprising the light emitting device of claim 1.

18. The light emitting device of claim 1, wherein the anion of the organic acid is citrate ion, and the metal oxide nanoparticles are represented by Chemical Formula 1:

$$Zn_{1-x}M_xO \qquad \text{Chemical Formula 1}$$

wherein M is Mg, Ca, Zr, W, Li, Ti, Y, Al, or a combination thereof, and $0 \leq x \leq 0.5$, wherein the electron auxiliary layer has an electrical conductivity of greater than about $6.5 \times 10^{-8}$ siemens per centimeter.

19. The light emitting device of claim 1, wherein the anion of the organic acid is acetate ion, and the metal oxide nanoparticles are represented by Chemical Formula 1:

$$Zn_{1-x}M_xO \qquad \text{Chemical Formula 1}$$

wherein M is Mg, Ca, Zr, W, Li, Ti, Y, Al, or a combination thereof, and $0 \leq x \leq 0.5$, wherein the electron auxiliary layer has an electrical conductivity of greater than about $6.5 \times 10^{-8}$ siemens per centimeter.

20. The light emitting device of claim 1, wherein the anion of the organic acid is oxalate ion, and the metal oxide nanoparticles are represented by Chemical Formula 1:

$$Zn_{1-x}M_xO \qquad \text{Chemical Formula 1}$$

wherein M is Mg, Ca, Zr, W, Li, Ti, Y, Al, or a combination thereof, and $0 \leq x \leq 0.5$, wherein the electron auxiliary layer has an electrical conductivity of greater than about $6.5 \times 10^{-8}$ siemens per centimeter.

* * * * *